US011046193B2

(12) United States Patent
Sieber et al.

(10) Patent No.: US 11,046,193 B2
(45) Date of Patent: Jun. 29, 2021

(54) FOREIGN OBJECT DETECTION CIRCUIT USING CURRENT MEASUREMENT

(71) Applicant: WiTricity Corporation, Watertown, MA (US)

(72) Inventors: Lukas Sieber, Olten (CH); Hans Peter Widmer, Wohlenschwil (CH); Mircea-Florian Vancu, Schlieren (CH); Andreas Daetwyler, Muhen (CH)

(73) Assignee: WiTricity Corporation, Watertown, MA (US)

( * ) Notice: Subject to any disclaimer, the term of this patent is extended or adjusted under 35 U.S.C. 154(b) by 27 days.

(21) Appl. No.: 16/226,156

(22) Filed: Dec. 19, 2018

(65) Prior Publication Data

US 2019/0225099 A1 Jul. 25, 2019

Related U.S. Application Data

(60) Provisional application No. 62/620,622, filed on Jan. 23, 2018.

(51) Int. Cl.
*B60L 53/124* (2019.01)
*H02J 50/12* (2016.01)
(Continued)

(52) U.S. Cl.
CPC .............. *B60L 53/124* (2019.02); *B60L 53/12* (2019.02); *G01V 3/10* (2013.01); *G01V 3/104* (2013.01);
(Continued)

(58) Field of Classification Search
CPC ........ B60L 53/124; B60L 53/00; H02J 50/10; H02J 50/12; H02J 50/40; H02J 50/60;
(Continued)

(56) References Cited

U.S. PATENT DOCUMENTS

2009/0250384 A1* 10/2009 Valerio .................... B07C 5/344
209/571
2012/0026631 A1* 2/2012 Kazemi .................... H02H 7/20
361/42

(Continued)

FOREIGN PATENT DOCUMENTS

WO    2006037176    4/2006

OTHER PUBLICATIONS

"International Search Report and Written Opinion", PCT Application No. PCT/US2019/013983, Apr. 29. 2019, 15 pages.

*Primary Examiner* — Nguyen Tran
*Assistant Examiner* — Jagdeep S Dhillon
(74) *Attorney, Agent, or Firm* — Colby Nipper PLLC

(57) ABSTRACT

The present disclosure describes techniques for detecting foreign objects by detecting changes in an electrical characteristic of an array of sense elements for detection objects based on a current measurement approach. In some aspects, an apparatus for measuring changes in current for detecting objects is provided. The apparatus includes a plurality of sense circuits each comprising a sense coil, the plurality of sense circuits each electrically connected to a common output node. The apparatus further includes a driver circuit electrically connected to the plurality of sense circuits and configured to operate as a voltage source and selectively apply a voltage signal at an operating frequency to each of the plurality of sense circuits. The apparatus further includes a current measurement circuit electrically connected to the common output node. The current measurement circuit is configured to provide a measurement output proportional to an electrical current at the common output node.

30 Claims, 13 Drawing Sheets

(51) Int. Cl.
*H02J 50/60* (2016.01)
*G01V 3/10* (2006.01)
*B60L 53/12* (2019.01)
*G01R 19/00* (2006.01)

(52) U.S. Cl.
CPC .............. *H02J 50/12* (2016.02); *H02J 50/60* (2016.02); *G01R 19/0092* (2013.01)

(58) Field of Classification Search
CPC .... H02J 50/80; H02J 50/90; H02J 7/00; H02J 7/02; H02J 7/04; H02J 7/025; H02J 5/005; G01R 19/0092; H02P 6/12
USPC .................. 307/104, 149, 64, 80, 82, 38, 44
See application file for complete search history.

(56) References Cited

U.S. PATENT DOCUMENTS

| | | |
|---|---|---|
| 2012/0206138 A1 | 8/2012 | Derungs |
| 2013/0314014 A1* | 11/2013 | Tremel .................... H02M 1/32 318/400.22 |
| 2014/0015329 A1 | 1/2014 | Widmer et al. |
| 2015/0355121 A1 | 12/2015 | Stierli |
| 2016/0064952 A1* | 3/2016 | Matsumoto ............. H02J 50/40 307/104 |
| 2016/0187520 A1 | 6/2016 | Widmer et al. |
| 2017/0074908 A1* | 3/2017 | Nejatali .................. H02J 7/025 |
| 2019/0103771 A1* | 4/2019 | Piasecki .............. H04B 5/0037 |
| 2019/0148987 A1* | 5/2019 | Jung .................. H02J 7/00304 307/104 |

\* cited by examiner

FOREIGN OBJECT DETECTION CIRCUIT USING CURRENT MEASUREMENT

CLAIM OF PRIORITY UNDER 35 U.S.C. § 119

The present Application for Patent claims priority to Provisional Application No. 62/620,622 entitled "FOREIGN OBJECT DETECTION CIRCUIT USING CURRENT MEASUREMENT" filed Jan. 23, 2018 and assigned to the assignee hereof and hereby expressly incorporated by reference herein in its entirety.

FIELD

The present disclosure relates generally to object detection, for example, in an application for inductive power transfer. In particular, the present disclosure is directed to a circuit for measuring changes in current in a plurality of sense coils.

BACKGROUND

Object detection may be valuable for a variety of applications, and in particular for applications where it may be useful to detect objects within a predetermined region. For example, in certain inductive power transfer applications (or other types of wireless power transfer applications) it may be useful to be able to rapidly detect foreign objects that may be present in an inductive power region and that could be susceptible to induction heating due to the high magnetic field strength in that region. In an inductive wireless electric vehicle charging (WEVC) system, magnetic flux densities above a transmit coil (e.g., a primary coil) can be at relatively high levels to allow for sufficient power transfer (e.g., for a WEVC system power may be transferred on the order of kilowatts—e.g., 3.3 kW, 11 kW, and the like). Metallic objects or other objects present in the magnetic field can experience undesirable induction heating. For this reason, foreign object detection (FOD) may be implemented to detect metal objects or other objects that are affected by a magnetic field generated by the coils of the wireless power transfer system. Solutions for improving sensitivity, cost effectiveness, accuracy, and reliability of an object detection system for various applications and such as for WEVC applications are desired.

SUMMARY

In one aspect of the disclosure, an apparatus for measuring changes in current for detecting objects is provided. The apparatus includes a plurality of sense circuits each comprising a sense coil. The plurality of sense circuits are each electrically connected to a common output node. The apparatus further includes a driver circuit electrically connected to the plurality of sense circuits and configured to operate as a voltage source and selectively apply a voltage signal at an operating frequency to each of the plurality of sense circuits. The apparatus further includes a current measurement circuit electrically connected to the common output node. The current measurement circuit is configured to provide a measurement output proportional to an electrical current at the common output node.

In another aspect of the disclosure, an apparatus for measuring current is provided. The apparatus includes an amplifier having a first amplifier input, a second amplifier input, and an amplifier output. The apparatus further includes a plurality of sense circuits each comprising a sense coil. The plurality of sense circuits are each electrically connected to a common output node. The apparatus further includes a plurality of a switch circuits each electrically connected between the amplifier and a respective one of the plurality of sense circuits. Each of the plurality of switch circuits include a first switch electrically connected between the amplifier output of the amplifier and the respective one of the plurality of sense circuits. Each of the plurality of switch circuits further include a second switch electrically connected between the second amplifier input and a point between an output of the first switch and the respective one of the plurality of sense circuits.

In yet another aspect of the disclosure, a method for measuring changes in current for detecting objects is provided. The method includes applying, from a voltage source, a voltage signal at an operating frequency to at least one of a plurality of sense circuits each comprising a sense coil. The plurality of sense circuits are each electrically connected to a common output node. The method further includes generating, at a current measurement circuit electrically connected to the common output node, a measurement output proportional to an electrical current at the common output node. The method further includes detecting whether an object is in proximity to at least one sense coil of the plurality of sense coils based on the measurement output proportional to the electrical current.

In yet another aspect of the disclosure, an apparatus for measuring changes in current for detecting objects is provided. The apparatus includes a plurality of sense circuits each comprising a sense coil. The plurality of sense circuits are each electrically connected to a common output node. The apparatus further includes means for operating as a voltage source and selectively applying a voltage signal at an operating frequency to each of the plurality of sense circuits. The apparatus further includes means for measuring electrical current at the common output node. The means for measuring electrical current including means for providing a measurement output proportional to an electrical current at the common output node.

BRIEF DESCRIPTION OF THE DRAWINGS

In the figures, the left-most digit of a reference number identifies the figure in which the reference number first appears. The use of the same reference numbers in different instances in the description or the figures indicates like elements.

DETAILED DESCRIPTION

Figure 1:
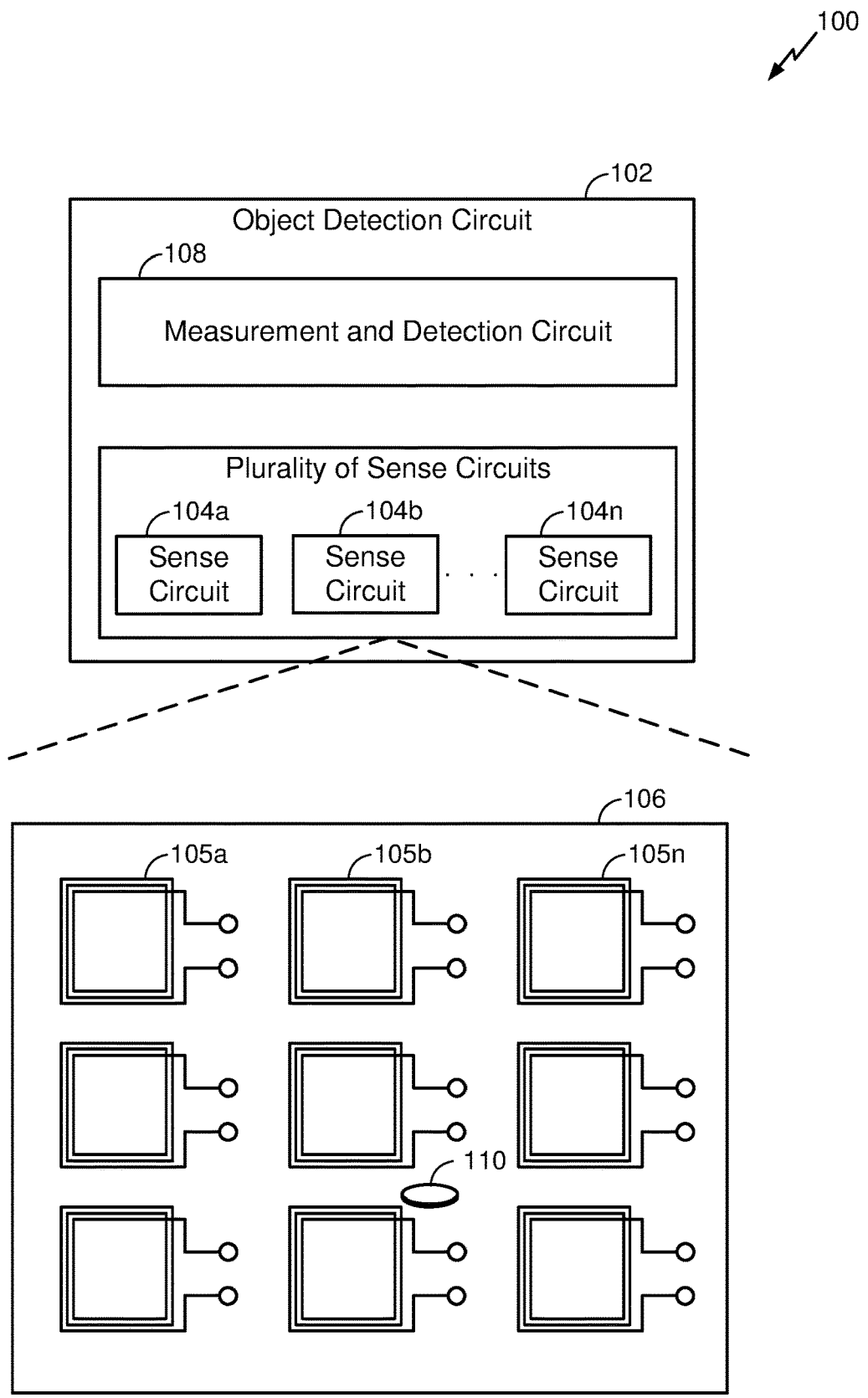
FIG. 1 illustrates an example implementation of an object detection circuit.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

As mentioned above, object detection (and particularly metal object detection) may be valuable for a variety of applications. For detection in a predetermined region (space) an object detection system may include a plurality of sense elements distributed across a predetermined area. This predetermined region, which may be proximate the predetermined area, may be defined by the space where metal objects may be found and where the magnetic flux density exceeds certain limits (e.g., a threshold determined based on what levels of temperature an object 110 might be heated up). The number of sense elements may be proportional or related to the minimum size of objects that are desirable to be detected. For a system that is configured to detect small objects (e.g., the size of a paper clip), the number of sense elements may be relatively high. Drive circuitry for applying sense signals to each of the sense elements, additional circuitry for conditioning of the sense elements, as well as corresponding detection and measurement circuitry for looking for changes in electrical characteristics that may correspond to the presence of an object may be costly or complex as the number of sense elements increases.

Aspects of implementations described herein relate to a configuration for driving and measurement circuitry for a plurality of sense elements that allows for accuracy and sensitivity to be maintained for detecting smaller objects while allowing for a cost-effective implementation. Aspects described herein relate to an implementation for an object detection circuit based on a current measurement approach that includes a sense signal source characterized by a voltage source (e.g., quasi-ideal voltage source) that is provided that allows for determining impedance changes based on a measurement of changes in current at one or more sense elements. Aspects of implementations based on this current measurement approach described in detail below allow for reducing circuit complexity and lowing the overall cost of object detection circuitry.

FIG. 1 illustrates an example implementation of a system 100 that includes an object detection circuit 102. The object detection circuit 102 includes a plurality of sense circuits 104a, 104b, and 104n. As shown in FIG. 1, each sense circuit 104a, 104b, and 104n includes corresponding sense coil 105a, 105b, 105n, respectively, configured to sense a change in one or more electrical characteristics that change in response to the presence of the object 110 in proximity to the sense coil 105a, 105b, or 105n to be able to provide detection coverage for an entire predetermined detection region. Each sense circuit 104a, 104b, and 104n may also include additional conditioning circuitry (not shown in FIG. 1) configured to improve measurement of a change in the one or more electrical characteristics. Each sense circuit 104a, 104b, and 104n also defines an output (measurement port) (not shown in FIG. 1) where the change in an electrical characteristic (e.g. an impedance) is measured and refers to. In some implementations the sense coils may be arranged in a sense coil array 106.

Sense coils 105a, 105b, and 105n are shown in FIG. 1 as "circular" coils for purposes of illustration. However, in other implementation, the sense coils 105a, 105b, and 105n may have another coil topology e.g. a figure-eight-like (DD) topology (not shown herein). In further implementations, the sense coils 105a, 105b, and 105n may be of a mixed coil topology e.g. "circular" and DD. In yet other implementations, the sense coils 105a, 105b, and 105n as shown in FIG. 1 may represent other types of sense elements that may be used in the implementations described herein that may be configured to be used to detect changes in electrical characteristics to determine whether an object 110 is present. In some implementations, the sense coils 105a, 105b and 105n are arranged in an array, such as a two-dimensional array as shown in FIG. 1. However, in other implementations the sense coils 105a, 105b and 105n are arranged in other configurations that do not conform to rows or columns (radial or interleaved), are at least partially overlapping or have irregular spacing, have different size, have different shapes (circular, hexagonal, etc.), or cover irregular detection areas, or any combination. As such the term "array" as used herein denotes a plurality of sense coils 105a, 105b, and 105n that are arranged over a predetermined area. Furthermore, the number of sense coils 105a, 105b, and 105n and thus the number of sense circuits 104a, 104b, and 104n can vary widely based on the application including the total region in which the object 110 is to be detected and the smallest size of an object the system 100 is configured to detect.

Each of the plurality of sense circuits 104a, 104b, and 104n including corresponding sense coils 105a, 105b, and 105n are operably connected to a measurement and detection circuit 108. The measurement and detection circuit 108 is configured to measure one or more electrical characteristics at each of the plurality of sense circuits 104a, 104b, and 104n and process the measurements to output a signal indicative of whether presence of an object 110 is detected (and in some cases the location of the object 110 based on information about the particular sense coil 105a, 105b, or 105n at which the object 110 is detected). The measurement and detection circuit 108 may be configured to selectively apply a sense signal individually to each of the plurality of sense circuits 104a, 104b, and 104n (e.g., sequentially) to allow for measurement of changes in electrical characteristics at each of the plurality of sense circuits 104a, 104b, and 104n in response to the presence of the object 110. The measurement and detection circuit 108 further includes a measurement circuit to output a measurement value indicative of an electrical characteristic in each of the plurality of sense circuits 104a, 104b, and 104n.

The measurement and detection circuit 108 may include signal processing circuitry configured to process and filter the measurement output and determine whether an object 110 is potentially present (e.g., based on a time-differential approach). At least a portion of the measurement and detection circuit 108 may be implemented by one or more micro-controllers or processors. For example, at least a portion of the measurement and detection circuit 108 may be implemented as an application-specific integrated circuit (ASIC), a field programmable gate array (FPGA) device, digital signal processor (DSP), or another processor device. The measurement and detection circuit 108 may be configured to receive information from each of the components of the object detection circuit 108 and perform calculations based on the received information. The measurement and detection circuit 108 may be configured to generate control signals for each of the components that may adjust the operation of that component. The measurement and detection circuit 108 further may further include a memory (not shown) configured to store data, for example, such as instructions for causing the measurement and detection circuit 108 to perform particular functions, such as those related to object detection. As will be described further, for purposes of selectively driving each of the plurality of sense circuits 104a, 104b, and 104n and measuring the output of each of the plurality of sense circuits 104a, 104b, and 104n further analog or other circuit components may be included in the measurement and detection circuit 108.

In an exemplary implementation, an object 110 is detected by applying a sinusoidal sense signal and by measuring a change of an impedance at each sense circuit 104a, 104b, and 104n. While the description may refer to sinusoidal signals it should be appreciated that any alternating voltage or alternating current may be applied and are contemplated by different implementations described herein. For example, the object detection circuit 102 may be configured to detect metallic objects (or other objects) that can cause changes in impedance at a sense circuit 104a, 104b, or 104n). In an exemplary implementation, the measurement and detection circuit 108 is configured to cause each of the plurality of sense coils 105a, 105b, and 105n (e.g., sequentially) to generate an alternating magnetic field at an operating frequency. If a metallic object 110 is present in the alternating magnetic field, voltages induced due to the alternating magnetic field may cause eddy currents in the metallic object 110. According to Lentz' law, the eddy currents in the object 110 will generate another (secondary) magnetic field that interacts with the sense coils 105a, 105b, or 105n (e.g., a mutual coupling is developed) and the impedance is changed at the terminals of at least a portion of the plurality of sense coils 105a, 105b, and 105n and thus at the corresponding sense circuits 104a, 104b, or 104n. Other interactions such as electric field (capacitive) interactions or ferromagnetic interaction between an object 110 and the sense coils 105a, 105b, and 105n are also possible that cause impedance changes at the terminals of the sense coils 105a, 105b, or 105n.

In other implementations, an object 110 is detected by applying a sense signal different from a sinusoidal signal (single frequency) and by measuring a change in a response to that signal. In an exemplary implementation, the measurement and detection circuit 108 is configured to selectively (e.g., sequentially) excite each of the plurality of sense coils 105a, 105b, and 105n with a pulse suitable for measuring an impulse response and presence of an object is determined based on measuring a change in an impulse response in each of the plurality of sense circuits 104a, 104b, and 104n.

In another exemplary implementation, the measurement and detection circuit 108 is configured to selectively (e.g., sequentially) excite each of the plurality of sense coils 105a, 105b, and 105n with a multiple frequency (multi-tone) signal and presence of an object is determined based on measuring a change in impedance in each of the plurality of sense circuits 104a, 104b, and 104n and for each frequency component individually.

In another exemplary implementation, the measurement and detection circuit 108 is configured to selectively (e.g., sequentially) excite each of the plurality of sense coils 105a, 105b, and 105n with another suitable waveform (e.g., a pseudo-noise signal) and presence of an object 110 is determined based on measuring a change in a response to that waveform in each of the plurality of sense circuits 104a, 104b, and 104n.

The descriptions of the object detection circuit 102 herein assume a measurement and detection circuit 102 that is configured to detect changes in impedance at a single frequency and determine if the metallic object 110 is present in proximity to at least one of the sense coils 105a, 105b, and 105n. However, this should not exclude implementations using a measurement and detection circuit 102 that is configured to detect changes in one or more electrical characteristics using other sense signal waveforms to determine whether an object 110 is present.

Example Inductive Wireless Power Application for Object Detection

The object detection circuit 102 may be used in a variety of applications for detecting objects, such as metallic objects, within a predetermined detection region as previously defined. In one example mentioned above, in an inductive wireless power transfer system, magnetic flux densities above a transmit coil (e.g., a primary coil) and below a receive coil (e.g., secondary coil) can be at relatively high levels to allow for sufficient power transfer (e.g., for a wireless electric vehicle charging (WEVC) system power may be transferred on the order of kilowatts, e.g., 3.3 kW, 11 kW, or at even higher levels). Metallic objects or other objects present in the magnetic field can experience undesirable induction heating based on interaction with the wireless power field. For this reason, the object detection circuit 102 may be integrated into an inductive wireless power transfer system to detect metal objects or other objects that are affected by a magnetic field generated by the coils used for the wireless power transfer. Such detection may allow the wireless power transfer system to respond appropriately (e.g., reduce or stop power transmission, alert a user, and the like).

Figure 2A:
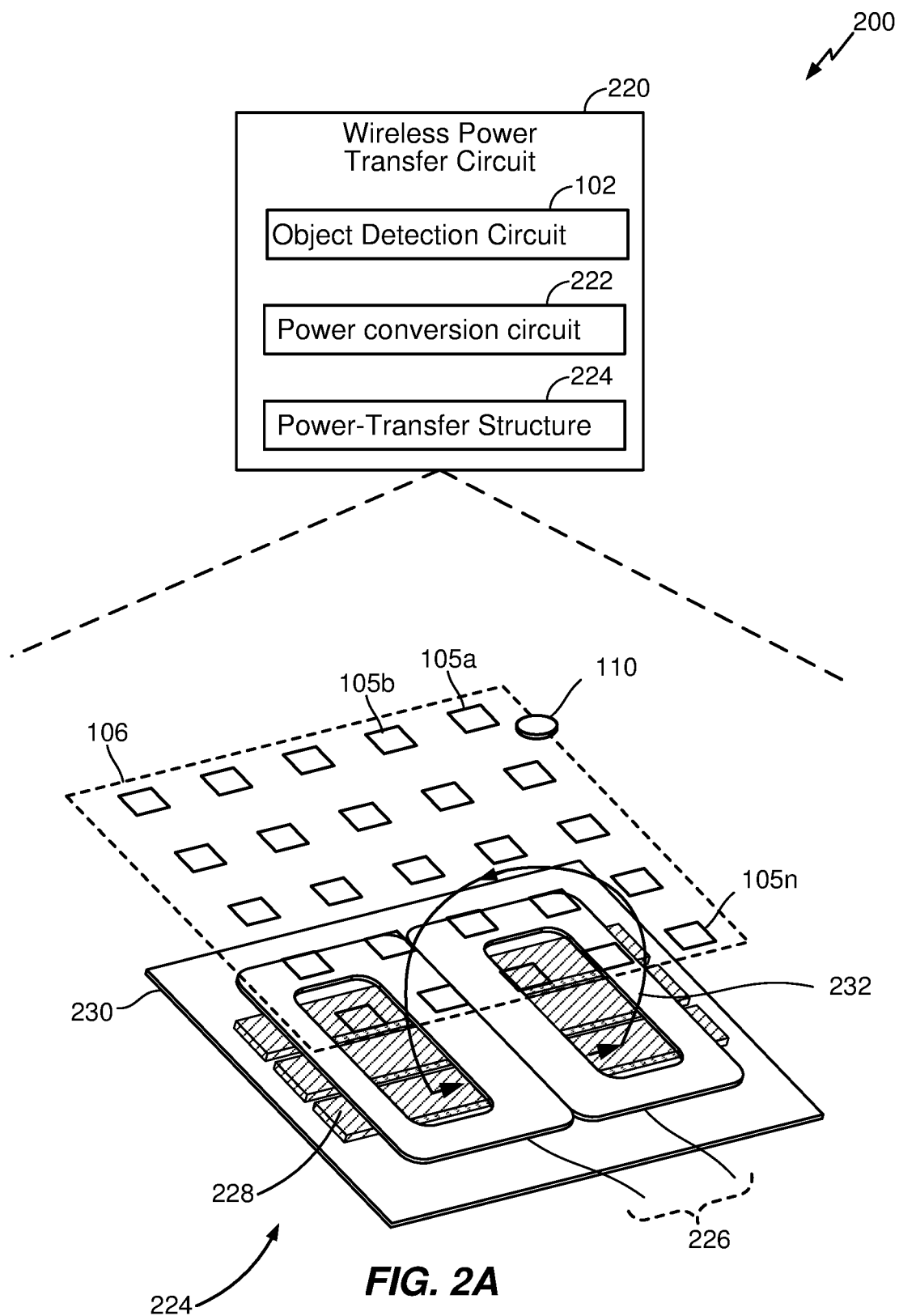
FIG. 2A illustrates an example implementation of a wireless power transfer apparatus including a wireless power transfer circuit with the object detection circuit of FIG. 1.

FIG. 2A illustrates an example implementation of a wireless power transfer apparatus 200 including a wireless power transfer circuit 220 with the object detection circuit 102 of FIG. 1. The wireless power transfer circuit 220 may depict either a wireless power transmit circuit that generates a magnetic field 232 for transferring power or a wireless power receive circuit that can couple and receive power via the magnetic field 232. The wireless power transfer circuit 220 includes a power conversion circuit 222 and a power transfer structure 224. When the wireless power transfer circuit 220 is configured as a wireless power transmit circuit, the power conversion circuit 222 is configured to convert power from a power source (not shown) to a suitable operating frequency and form for wireless power transfer via the power transfer structure 224. It may be more likely that when integrated with an object detection circuit 102 the wireless power transfer circuit 220 may be a wireless power transmit circuit as power may be generally transferred from the ground or other upward facing surface where metallic objects will generally come to a rest. However other implementations are possible, e.g. an object detection circuit 102 or a portion thereof may be also integrated with a wireless power receive circuit. When the wireless power transfer circuit 220 is configured as a wireless power receive circuit, the power conversion circuit 222 is configured to convert power received via the power transfer structure 224 into a suitable form (e.g., DC with a suitable voltage and current level) for providing power to a load, such as a battery.

The power transfer structure 224 (also sometimes referred to as a "pad") is configured to wirelessly transmit or receive power. FIG. 2A illustrates one example of a power transfer structure 224 and how the sense coil array 106 of FIG. 1 may be integrated. The power transfer structure 224 includes a coil 226 configured to generate an alternating magnetic field when driven with a current by the power conversion circuit 222. The power transfer structure 224 may further include ferrite 228 configured to channel and/or provide a path for magnetic flux (e.g., may be arranged in one or more ferrite bars which can be a combination of ferrite tiles arranged to form the bars). The power transfer structure may also include a shield 230 (also sometimes referred to as a back plate). The shield 230 is configured to prevent the magnetic field 232 or associated electromagnetic emissions from extending beyond a boundary determined by the shield 230 or at least to attenuate the magnetic field 232 extending beyond that boundary. As an example, the shield 230 may be formed from aluminum.

In the illustrated example, the power transfer structure 224 includes a double-D (DD) coil topology, which includes two electrically conductive coils 226 disposed proximate to one another. The coils 226 are configured to generate a magnetic field (indicated in FIG. 2A by line of flux 232) by running alternating current through the coils 226. Generally, the current in the two center sections of the DD coil runs in the same direction. In this way, a high magnetic flux is generated in the center of the power transfer structure 224 and is channeled through the ferrite 228 and arches above the DD coil from one opening (magnetic pole area) to the other opening (magnetic pole area) of the DD coil 226 as indicated in FIG. 2A by a line of flux. Other coil topologies are also applicable to the techniques described herein, including a multi-coil topology (e.g., Bi-Polar, DD plus Circular) or just a single coil Circular or Solenoid topology.

The wireless power transfer circuit further includes an object detection circuit 102 that may include a plurality of sense circuits that may include a plurality of sense coils 105a, and 105n arranged in an array 106 (sense coil array 106) as illustrated in FIG. 2A. The plurality of sense coils 105a, 105b, 105n may be arranged in a substantially planar array to cover a predetermined area (e.g., at least the area covered by the coil 226 and ferrite 228). The size and the number of sense coils 105a, 105b, 105n may depend on the size of the wireless power coil 226 and/or ferrite 228 and also on the smallest size of an object 110 that is required to be detected by the object detection circuit 102. For example, if the minimum size of a metallic object 110 required to be detected is the size of a coin or a paper clip, then the size of each sense coil 105a, 105b, 105n may be either on the order of this minimum size or within several (e.g. 2-3) orders of magnitudes larger, assuming that those minimum size objects are located in close proximity of a plane defined by the array of sense coils 105a, 105b, 105n (e.g. on the top surface of the housing 236 of the base pad as shown later in FIG. 2B). As a mere illustrative example, the number of sense coils 105a, 105b, 105n could be on the order of 64 (e.g., 8×8 array) to be able to provide coverage of the entire predetermined area.

Further the system shown in FIG. 2A may include a housing (not shown in FIG. 2A but shown later in FIG. 2B as housing 236) configured to house, for example at least the wireless power transfer coil 226, the ferrite 228, the sense coil array 106, and potentially the shield 230. The housing 236 may be made of any suitable material (e.g., hard plastic, ceramics etc.) and can be designed to provide structural support for example to support the weight of various objects such as vehicles that may pass over the housing 236. In some implementations, the housing 236 may be made of a non-conductive material to avoid interfering or interacting with the magnetic field 232. The sense coil array 106, in one exemplary implementation, is positioned between the wireless power transfer coil 226 and the housing 236 (with other intervening layers if desired) so that the sense coils 105a, 105n are positioned closer to objects that may rest on the surface of the housing 236 and where magnetic field levels could be high during power transfer.

All or just a portion of the power conversion circuit 222 may also be housed in the housing 236. Although in some implementations the power conversion circuit 222 may be housed separately from the housing 236 that houses the power transfer structure 224. In some cases, the power conversion circuit 222 is housed in the housing 236 but is positioned on the other side of the shield 230 from the ferrite 228.

Figure 2B:
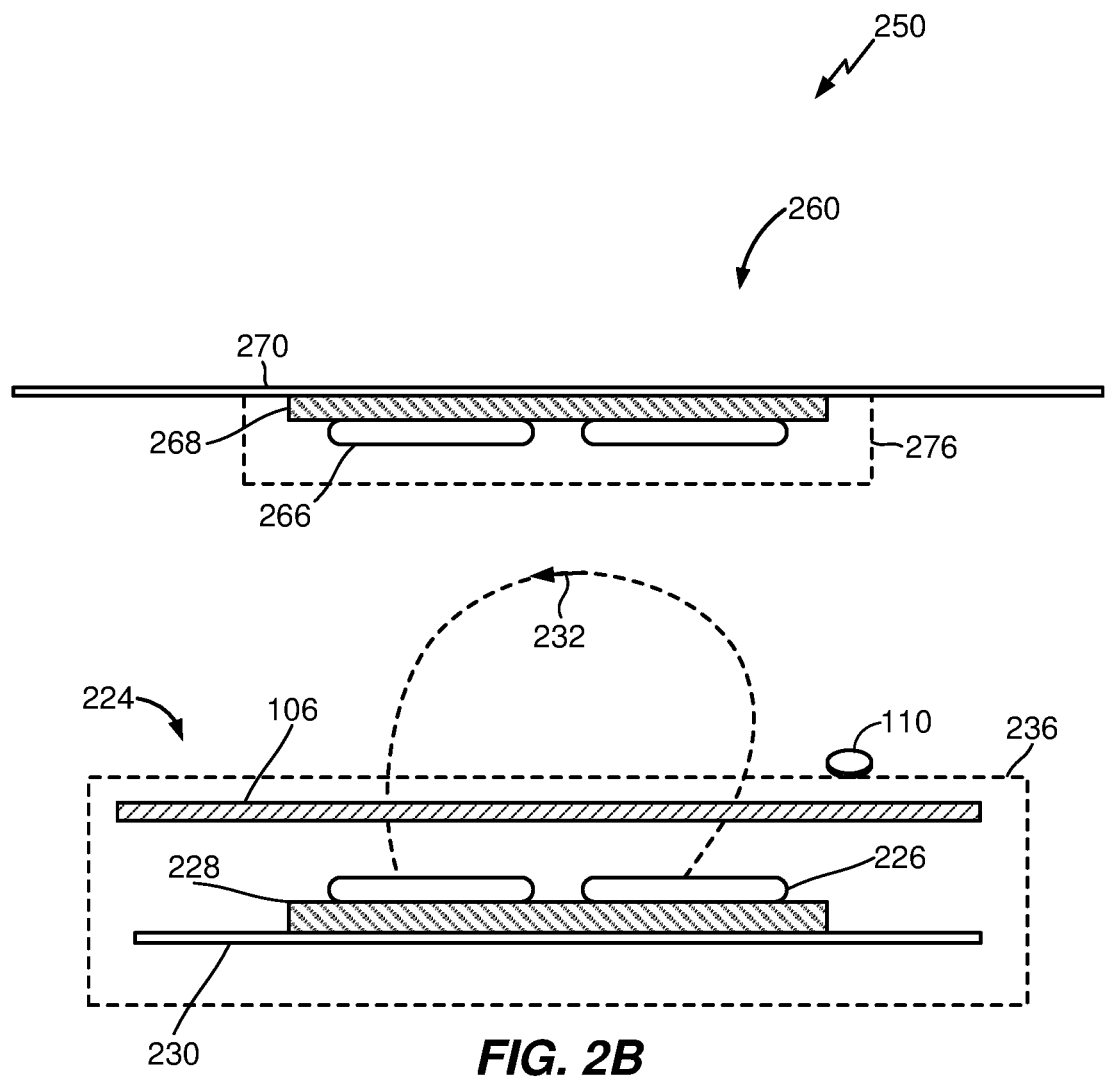
FIG. 2B illustrates a side view of a wireless power transfer apparatus including the object detection circuit of FIG. 1.

FIG. 2B illustrates a side view of a wireless power transfer system 250 including portions of the wireless power transfer circuit 220 of FIG. 2A. FIG. 2B includes a wireless power transmit structure 224 (that may be a part of the wireless power transfer circuit 220 of FIG. 2A) and a wireless power receive structure 260. The wireless power transmit structure 224 includes a shield 230, a layer of ferrite 228, and a transmit coil 226. A housing 236 configured to house the transmit coil 226, ferrite 228, and shield 230 may be provided. In addition, the housing 236 is configured to house a sense coil array 106 as shown in FIG. 2A. In some implementations, the shield 230 may form a portion of the housing 236. The power conversion circuit 222 is not shown but may be electrically connected to the transmit coil 226 or a portion or all may also be housed in the housing 236.

The wireless power receive structure 260 includes a receive coil 266, a layer of ferrite 268, and a shield 270. In some implementations, the shield 270 may be formed from a portion of the apparatus that the ferrite 268 and receive coil 266 are affixed to (e.g., the metallic underbody of a vehicle if in a WEVC application). In this case, a housing 276 configured to house the receive coil 266 and ferrite 268 is provided but that would not house the shield 270. However other implementations are possible where a shield 270 is included in the housing 276. A power conversion circuit 222 is not shown but may be electrically connected to the receive coil 268 or a portion or all may also be housed in the housing 276.

The wireless power transmit structure 224 is configured to generate a magnetic field 232. The wireless power receive structure 260 is configured to inductively receive power via the magnetic field 232. Magnetic flux 232 may be at a particular level (density) at the surface of the housing 236 (and in some cases, it may be somewhat higher at or in proximity to the surface of the housing 236 relative to surrounding areas as the surface of the housing 236 is closer to the coil 226). Furthermore, as the wireless power transmit structure 224 may be positioned on a ground or other top facing surface, an object 110 may come to rest of the surface of the housing 236. The object 110 may thereby be potentially exposed to high levels (density) of magnetic flux if power is being transferred. The object detection circuit 102 is configured to detect the object 110.

Object Detection Measurement Techniques

FIGS. 3A, 3B, 3C, and 3D illustrate examples of different techniques for measuring a change in impedance at a sense coil 305 due to presence of an object 110 based on different electrical characteristics that may be used in conjunction with the object detection circuit 102 of FIG. 1. In these examples, the sense circuit is comprised of the sense coil 305 only (special case). Therefore, the measurement port (reference plane) for measuring the impedance is at the terminals of the sense coil 305.

Figure 3A:
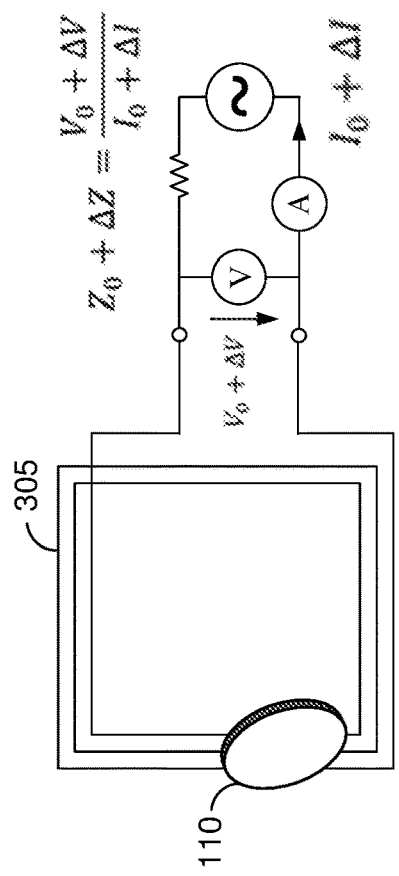
FIGS. 3A, 3B, 3C, and 3D illustrate examples of sense coils and associated techniques for measuring changes in impedance based on different electrical characteristics that may be used in conjunction with the object detection circuit of FIG. 1.
Figure 3B:
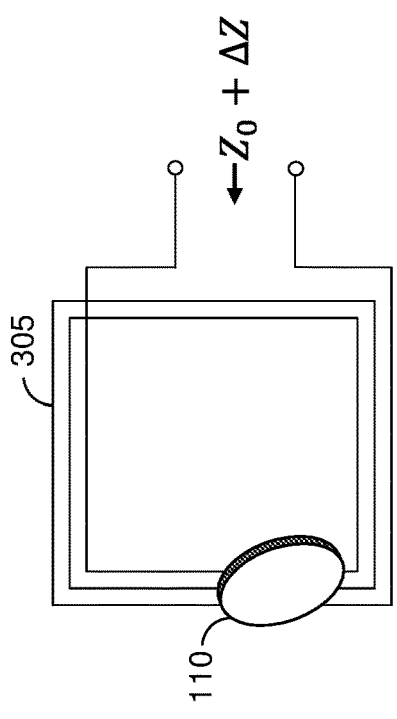

FIG. 3A illustrates a principle for detecting a presence of a metallic object 110 by detecting a change $\Delta Z$ of an impedance $Z_0$ measured at the terminals of a sense coil 305 that may be one of a plurality of sense coils (sense coil array). $Z_0$ denotes the impedance in absence of the object 110. A change $\Delta Z$ of the impedance relative to the impedance $Z_0$ in the absence of the object 110 may indicate a presence of the metallic object 110. The impedance $Z_0$ may be the complex impedance. FIG. 3B illustrates a technique for impedance measurement by connecting the sense coil 305 to a sinusoidal signal source with an unspecified source impedance and measuring voltage and current at terminals of the sense coil 305. The impedance $Z_0+\Delta Z$ of the sense coil 305b is determined by the quotient of the measured voltage $V_0+\Delta V$ and the measured current $I_0+\Delta I$, more formally:

$$Z_0 + \Delta Z = \frac{V_0 + \Delta V}{I_0 + \Delta I} \qquad \text{(Equation 1)}$$

Presence of a metallic object 110 in proximity of the sense coil 305b generally manifests in a change $\Delta V$ of the voltage $V_0$ as well as in a change $\Delta I$ of the current $I_0$ as measured in absence of the object, respectively. Therefore, this technique may require a sensitive (e.g., narrow-band) measurement of both current and voltage (with respect to both amplitude and phase) in order to accurately determine the change in impedance $\Delta Z$ produced by an object 110.

Figure 3C:
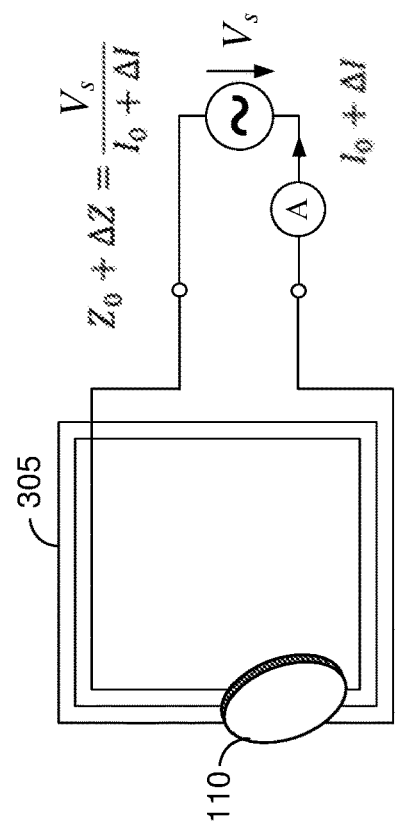

In principle, measuring one of a voltage or a current only may suffice for detecting a metallic object 110 as both voltage and current may generally be altered in presence of an object 110. It may however be appreciated that determining a change of the true complex impedance, requiring both a voltage and current measurement may provide a more sensitive, reliable, and accurate object detection solution that may be also capable of discriminating between objects potentially susceptible to induction heating and uncritical objects. FIG. 3C illustrates another technique for impedance measurement where an ideal sinusoidal current source with a defined current $I_s$ (amplitude and phase) is applied to the sense coil 305 and the voltage across the terminals of the sense coil 305 is measured. The impedance $Z_0+\Delta Z$ of the sense coil 305 is determined by computing the quotient of the measured voltage $V_0+\Delta V$ and the defined current $I_s$, more formally:

$$Z_0 + \Delta Z = \frac{V_0 + \Delta V}{I_s} \qquad \text{(Equation 2)}$$

Presence of a metallic object 110 in proximity of the sense coil manifests in a change $\Delta V$ of the voltage $V_0$ as measured in absence of the object 110. Complexity is reduced as no sensitive current measurement needs to be performed. This technique is also referred herein as to the voltage measurement approach.

Figure 3D:
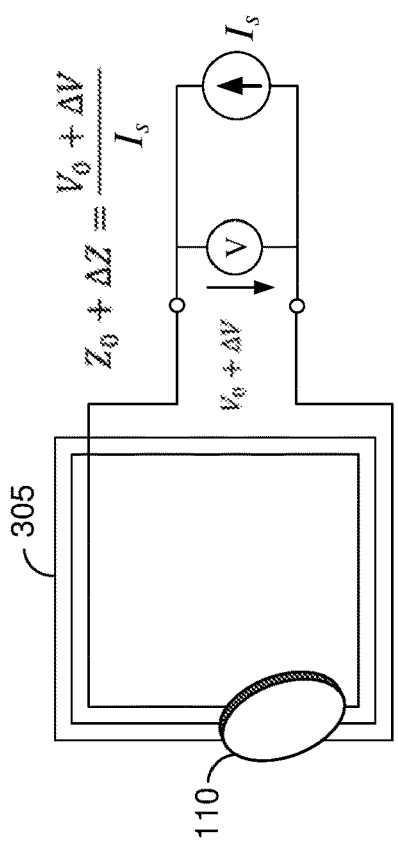

FIG. 3D illustrates an alternative technique for impedance measurement as compared to FIG. 3C. In the case of FIG. 3D, an ideal sinusoidal voltage source with a defined voltage $V_s$ (amplitude and phase) is applied to the sense coil 305 and current in the sense coil 305 is measured. The impedance $Z_0+\Delta Z$ of the sense coil 305 is determined by computing the quotient of the defined voltage $V_s$ and the measured current $I_0+\Delta I$, more formally:

$$Z_0 + \Delta Z = \frac{V_s}{I_0 + \Delta I} \qquad \text{(Equation 3)}$$

Presence of a metallic object 110 in proximity of the sense coil 305d generally manifests in a change $\Delta I$ of the current $I_0$ as measured in absence of the object. Complexity is reduced as no sensitive voltage measurement needs to be performed. This technique is also referred herein as to the current measurement approach.

The current source as needed in a practical implementation of the voltage measurement approach may be characterized by a quasi-ideal current source. A quasi-ideal sinusoidal current source may be defined as a sinusoidal signal source with a sufficiently large (but finite) source impedance so that the magnitude of the fractional change in its output current $|\Delta I/I_{s,0}|$ is at least a factor of 10 smaller than the magnitude of the fractional change in its output voltage $|\Delta V/V_0|$, where $\Delta I$ and $\Delta V$ denote the change in the complex amplitude (magnitude and phase) of its output current and voltage, respectively, due to presence of an object (e.g. object 110) and $I_{s,0}$ and $V_0$ the complex amplitude of its output current and voltage, respectively, in absence of the object.

Likewise, the voltage source as needed in a practical implementation of the current measurement approach may be characterized by a quasi-ideal voltage source. A quasi-ideal sinusoidal voltage source may be defined as a sinusoidal signal source with a sufficiently small (but non-zero) source impedance so that the magnitude of the fractional change of its output voltage $|\Delta V/V_{s,0}|$ is at least a factor of 10 smaller than the magnitude of the fractional change of its output current $|\Delta I/I_0|$, where $\Delta V$ and $\Delta I$ denote the change in complex amplitude (magnitude and phase) of its output voltage and current, respectively, due to presence of an object (e.g. object 110) and $V_{s,0}$ and $I_0$ the complex amplitude of its output voltage and current, respectively, in absence of the object.

Above definitions may be generalized to non-sinusoidal signal (arbitrary waveform) sources, where the notions of complex impedance and complex amplitude may not directly apply. This may be accomplished by approximating the signal by a complex Fourier series and applying above definitions to the individual frequency components of the complex Fourier series.

Some complexity may be introduced when applying the above techniques to an array of sense circuits 104a, 104b, and 104n where circuitry may be needed to apply a sense signal selectively to each sense circuit 104a, 104b, and 104n and to measure an electrical characteristic at each sense circuit 104a, 104b, and 104n individually. The introduction of multiple sense circuits 104a, 104b, and 104n may also result in an increase of noise level impacting measurement of an electrical characteristic of any of the sense circuits 104a, 104b, and 104n (e.g., noise coupled inductively or capacitively into sense circuits 104a, 104b, and 104n by the wireless power electromagnetic fields if sense circuits 104a, 104b, and 104n are integrated in a wireless power transfer system). Therefore, additional circuitry may be used to avoid such increase of noise level.

Voltage Measurement Approach

Figure 4:
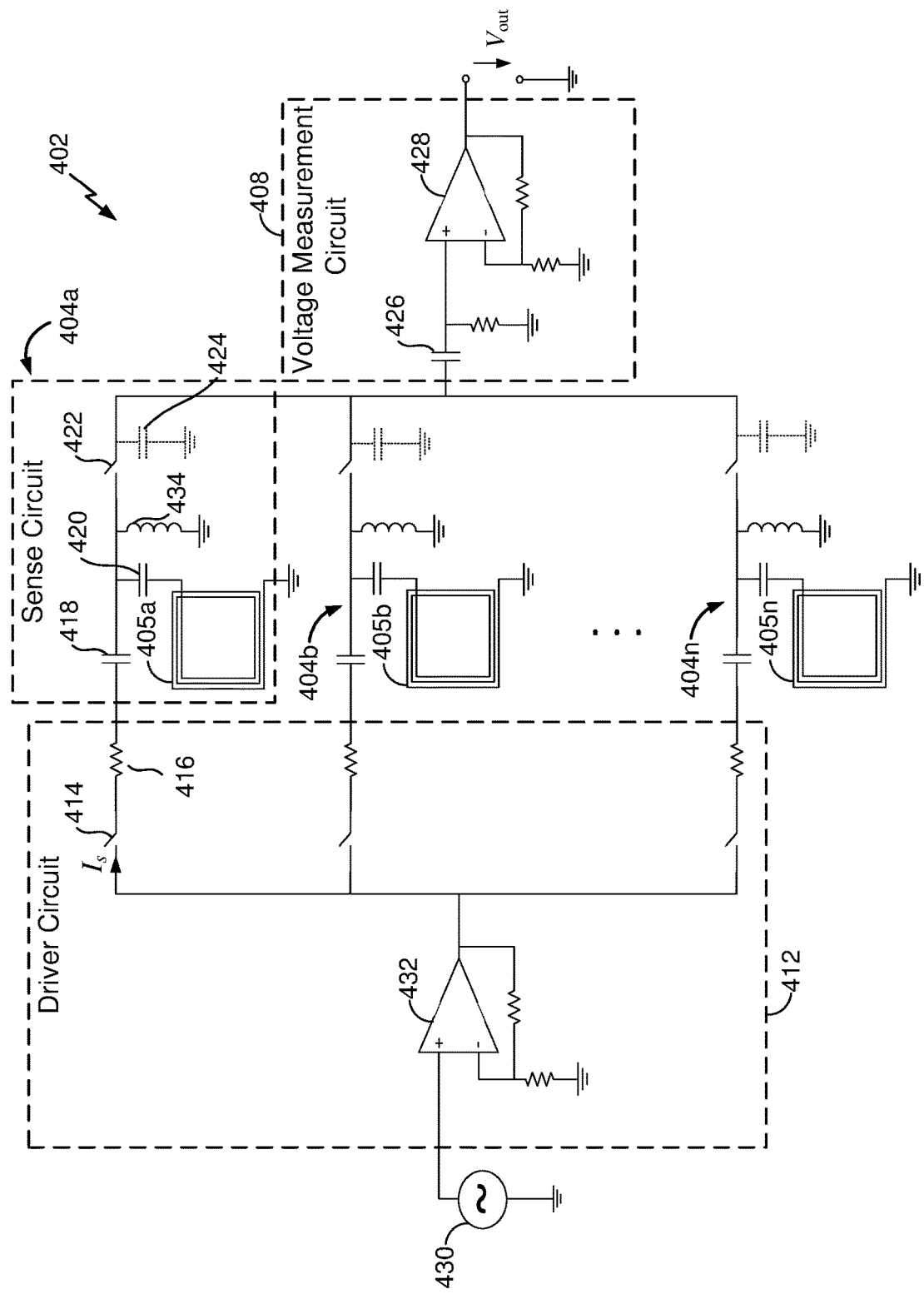
FIG. 4 illustrates a schematic view of an example of an implementation of a portion of an object detection circuit based on a voltage measurement approach.

FIG. 4 illustrates a schematic view of an example of an implementation of a portion of an object detection circuit 402. The implementation described with respect to FIG. 4 is based on the voltage measurement approach as illustrated in FIG. 3C. FIG. 4 illustrates the analog front-end circuit portion and for purposes of illustration may exclude various other signal generation, processing and detection circuitry that may be needed for determining whether an object is present in proximity to one of the sense coils 405a, 405b, 405n.

The analog front-end circuit portion of the object detection circuit 402 as shown in FIG. 4 may be subdivided into a driver circuit 412, a plurality of sense circuits 404a, 404b, 404n, and a voltage measurement circuit 408. An input analog multiplexer circuit (plurality of switches 414) shown in FIG. 4 as part of the driver circuit 412 is configured to selectively connect each of the plurality of sense circuit 404a, 404b, 404n to the driver circuit 412 to selectively drive each of the plurality of sense circuit 404a, 404b, 404n with a sense current at an operating (sense) frequency, as explained in more detail below. In one operational example, only one sense circuit of the plurality of sense circuits 404a, 404b, and 404n is driven at a time. An output analog multiplexer circuit (plurality of switches 422) shown in FIG. 4 as part of the plurality of sense circuits 404a, 404b, and 404n is configured to selectively connect each of the plurality of sense circuits 404a, 404b, and 404n to the voltage measurements circuit 408, as explained in more detail below. In one operational example, the voltage of one of the plurality of sense circuits 404a, 404b, and 404n is measured at a time.

In the implementation shown in FIG. 4, the sense circuits 404a, 404b, 404n have an identical circuit topology. Therefore, descriptions given below for the sense circuit 404a also apply to the other sense circuits (e.g., 404b, 404n). The sense circuit 404a includes a sense coil 405a, a first capacitor 420 (e.g. tuning capacitor), a shunt inductor 434, a second capacitor 418 (e.g., DC block capacitor), and output multiplexer switch 422. The first capacitor 420 is included electrically in series with the sense coil 405a forming a series-resonant circuit. If operated near resonance, the first capacitor 420 compensates for the gross portion of the reactance of the sense coil 405a. This increases the fractional voltage change $\Delta V/V_0$ as produced by an object, where $\Delta V$ denotes the voltage change due to presence of an object and $V_0$ the voltage measured in absence of the object. As opposed to FIGS. 3B, 3C, 3D, the voltage $V_0+\Delta V$ may refer now to the voltage across the series-tuned sense circuit 404a (e.g., across shunt inductance 434). Increasing $\Delta V/V_0$ may reduce the required dynamic range of the voltage measurement circuit 408 and particularly the required resolution (number of bits) in a following analog-to-digital converter (ADC) (not shown in FIG. 4). An ADC may be used in some implementations to further process the output ($V_{out}$) of the voltage measurement filter circuit 408 in the digital domain.

In some implementations, the first capacitor 420 in each of the plurality of sense circuits 404a, 404, and 404n may be a capacitor with a low temperature coefficient providing high thermal stability (e.g., a NP0-type capacitor) reducing thermal drift of an electrical characteristic (e.g., an impedance) as measured at each of the plurality of sense circuits 404a, 404, and 404n.

Moreover, the series capacitor 420 acts as a high pass filter to attenuate the high voltages that may be induced into the sense coil 405a by the strong magnetic fields associated with the inductive power transfer (e.g., at 85 kHz) and to protect the sense coil 405a, the driver circuit 412, and the voltage measurement circuit 408 from damage by excessive current flow, consequent heating effects, overloading, or surpassing some voltage limits. To more effectively attenuate the voltage induced into the sense coil 405a by the magnetic field at the wireless power transfer frequency (e.g. 85 kHz) and low frequency harmonics thereof), a shunt inductor 434 is connected in parallel to (across) the series circuit of capacitor 420 and sense coil 405a (as shown in FIG. 4). Series capacitor 420 together with shunt inductor 434 form a $2^{nd}$ order high pass filter that attenuates the low frequency signal components to a level e.g., significantly below the level of the sense signal. Therefore, this filter may substantially reduce dynamic range requirements in the voltage measurement circuit 408 and in a following processing (e.g., ADC). The filter may also reduce any cross-modulation effects between the low frequency wireless power signal and the high frequency sense signal due to residual non-linear effects in the voltage measurement circuit 408. At sense frequencies (in the MHz range), this high pass filter may exert a minor impact on the voltage (impedance) measurement and which may be corrected (compensated for) in a digital processing (not shown in FIG. 408).

As one non-limiting example, the induced voltage in the sense coil 405a due to the presence of the wireless power field at (e.g. 85 kHz) may be on the order of 30 V or even more. The series capacitor 420 (e.g., 560 pF) presents at the wireless power frequency (e.g. 85 kHz) a relatively high reactance (e.g. 3 kΩ) and acts together with shunt inductor 434 (e.g. 5 uH) (relatively low reactance (e.g., 3Ω)) as an effective $2^{nd}$ order high pass filter substantially attenuating the voltage (e.g., by 60 dB) at the wireless power frequency (e.g., 85 kHz) with marginal falsification of the voltage as measured at sense frequency (e.g., 3 MHz).

The driver circuit 412 has an input configured to receive a signal from a signal source 430. For the purposes of measuring an impedance, the signal source 430 is a sinusoidal signal source generating a signal at an operating frequency such as in the MHz range (e.g. 3 MHz). As just one non-limiting example, the signal source 430 may be implemented as a digital circuit (e.g. a numerically controlled oscillator) whose digital output is converted to an analog signal using a digital-to-analog converter (DAC) followed by a signal reconstruction filter (not shown in FIG.

4). The driver circuit 412 includes a low noise driver amplifier 432 that is configured to receive the signal from the signal source 430 and is configured to amplify the signal and buffer the signal source.

The driver circuit 412 is electrically connected to the plurality of sense circuits 404a, 404b, and 404n via an input multiplexer including switch 414 electrically connected between the output of the amplifier 432 and the sense circuit 404a and corresponding switches 114 for each of the other sense circuits 404b and 404n. The switch 414 may be controlled by a controller (not shown) to selectively open and close the switch 414 to electrically connect the output of the amplifier 432 to the sense coil 405a desired for impedance measurement. By closing the corresponding switch 414 of the multiplexer, only the selected sense coil 405a of a plurality of N sense coils 405a, 405b, and 405n is driven with a current.

A signal source characterized by a current source (e.g., a quasi-ideal current source) generating a current $I_s$ with a sufficiently defined amplitude and phase is needed for the voltage measurement approach (see FIG. 3C). In the example implementation of FIG. 4, this is accomplished by inserting a series resistor 416 with a relatively large resistance between the switch 414 and the sense circuit 404a and likewise in each of the other sense circuit branches. This resistance merges with the resistance of the analog switch 414 to an even larger resistance. It may be appreciated that a series resistor 416 with a large enough resistance potentially transforms the voltage source output (or any unspecified source output) of the amplifier 432 to a quasi-ideal current source with an output current largely independent on potential changes in the impedance of the sense circuit 404a, in the resistance of resistor 416, and in the resistance of switch 414, which may also vary with temperature to some extent. Using the definitions as given above with reference to FIGS. 3C and 3D, a resistance may be large enough, if the resulting fractional current change $|\Delta I/I_{s,o}|$ due to presence of an object (e.g., object 110) is at least a factor of 10 smaller than the fractional voltage change $|\Delta V/V_0|$ as measured at the output (measurement port) of the sense circuit (e.g., 404a) (e.g., voltage across shunt inductor 434). On the other hand, given an output voltage constraint for the driver amplifier 432, a resistor 416 with a too large resistance may be counterproductive as it may result in a too low sense current ($I_s$) and thus in insufficient signal-to-noise ratio (SNR) and hence detection sensitivity. Using the following definition for the SNR $$SNR = \frac{I_s^2 \cdot |\Delta Z|^2}{V_n^2} \quad \text{(Equation 4)}$$

where $I_s$ denotes the RMS (root mean square) sense current, $|\Delta Z|$ the magnitude of the impedance change due to an object 110, and $V_n$ the RMS noise voltage at sense frequency (e.g. due to circuit intrinsic or extrinsic noise as previously discussed), the SNR (e.g., at the output ($V_{out}$) of the voltage measurement circuit 408) is proportional to the square of the sense current level. Therefore, in some implementations, the resistance may be a trade-off between sense current variation $|\Delta I/I_{s,o}|$ and SNR.

As one non-limiting example with an equivalent series-resonance resistance of a sense circuit (e.g., 405a) of 5Ω, an on-state resistance of 5Ω for the switch 414, and a resistor 416 with a resistance of 50Ω would satisfy the requirements for a quasi-ideal current source as defined above. This may be easily shown by assuming a magnitude impedance change $|\Delta Z|<<5\Omega$ due to presence of an object (e.g. object 110). Further, with a driver amplifier 432 with a maximum output voltage constraint of 5 $V_{pp}$, this would result in a sense current $I_s$ on the order of 30 $mA_{rms}$.

There may be an undesired DC-offset in the output of the driver amplifier 432. Therefore, a DC block capacitor 418 (e.g. 100 nF) following the series resistor 416 in each branch prevents from excessive DC flow from the driver amplifier's 432 output towards ground via shunt inductor 434 that may appear as a quasi-short-circuit for DC. Such DC component may be undesirable as it may unnecessarily load the driver amplifier 432 and also DC bias the shunt inductor 434 that may include a ferromagnetic core. driven with a current.

The voltage measurement circuit 408 that is common to the plurality (N) of sense circuits 404a, 404b, 404n is electrically connected to the selected sense circuit (e.g., 404a) by closing the corresponding switch 422 of the output multiplexer (including a switch 422 for each sense circuit branch). The voltage measurement circuit 408 is configured to measure in essence the voltage ($V_0+\Delta V$) at the output (measurement port) of the selected sense circuit (e.g., 404a) (e.g., voltage across shunt inductor 434). The voltage measurement circuit 408 includes a low noise voltage measurement amplifier 428 (e.g., generally acting as impedance buffer) and is configured to provide an output voltage $V_{out}$ that is substantially proportional to the voltage ($V_0+\Delta V$) at the output of the selected sense circuit (e.g., 404a). In some implementations, this output signal of the voltage measurement circuit 408 is low pass filtered (anti-aliasing filter), sampled and digitized in an ADC for further signal processing in the digital domain (not shown in FIG. 4).

An additional first order RC-high pass (HP) filter 426 (represented as a capacitor and resistor but could be other types of filter elements) as shown in FIG. 4 may be inserted between the output multiplexer and measurement amplifier 428 to further attenuate any residual low frequency component (e.g., 85 kHz) including DC. As one example, this filter may be designed for a 3-dB cut-off frequency at half of the sense frequency of the object detection circuit 402.

FIG. 4 also indicates parasitic capacitance 424 as typical for analog switches. This parasitic capacitance of each of the output multiplexer switches 422 appears in parallel in the sense circuit 404a, since each of the plurality (N) switches 422 is electrically connected to the input of the voltage measurement circuit 408. The resulting total capacitance (N-times larger) may also be subjected to thermal drifts. Therefore, it may impair (desensitize and falsify) the impedance measurement and thus the performance of the object detection circuit 402 in terms of detection sensitivity, accuracy, thermal stability, and false detection rate.

In principle, for measuring a change of an impedance in at least one of the plurality of sense circuits 404a, 404b, and 404n, the output multiplexer (plurality of switches 422) may be omitted, meaning that the voltage measurement circuit 408 is electrically connected to each sense circuit 404a, 404b, 404n (parallel connection). Therefore, omitting the output multiplexer may also eliminate the need for an input multiplexer. It may be appreciated that the resulting parallel connection of the plurality (N) of sense circuits 404a, 404b, 404n will reduce detection sensitivity of the object detection circuit 402. Parallel connection of the plurality (N) of sense circuits 404a, 404b, 404n may cause the sense current to be shared (divided) by the plurality of sense circuits 404a, 404b, 404n. In one aspect, considering an example of an object detection circuit 402 including a plurality (N) of sense circuits 404a, 404b, 404n, each tuned on a common resonant frequency, each having an equal resonance resistance and an equal induced noise level, the effective sense current would be N-times lower resulting in a $N^2$-times lower SNR (see Equation 4) and thus in a significantly lower detection sensitivity. However, as there is no more multiplexing (time division) the SNR may be improved by averaging voltage measurements over a time period equivalent to a full multiplexing cycle also referred to as the scan cycle of an object detection circuit using a sense coil array. In theory, this averaging will improve the SNR by a factor of N, yielding an SNR that is still N-times lower compared to an object detection circuit 402 using an output multiplexer. This loss in SNR may be further compensated for with a $\sqrt{N}$-times higher sense current (e.g. $\sqrt{N}$*30 mA). Depending on the number N (e.g., 64) this may result in a considerably more expensive driver circuit 412 and a considerably higher power consumption for the object detection circuit 402.

Omitting the output multiplexer (plurality of switches 422) resulting in a parallel connection of the plurality (N) of sense circuits 404a, 404b, and 404n may also reduce the fractional change $\Delta V/V_0$ of the voltage as measured at the combined output of the plurality of sense circuits 404a, 404b, and 404n by a factor of N, hence increasing dynamic range requirements in the voltage measurement circuit 408 and in any following signal processing (e.g., ADC). Defining the dynamic range as the ratio of the maximum voltage level to be processed to an equivalent intrinsic noise level determined by the voltage measurement circuit and any following processing (e.g., ADC quantization noise), it can be shown that the dynamic range would also increase by a factor of $\sqrt{N}$ requiring e.g. a more expensive ADC. A loss in fractional change $\Delta V/V_0$ may also increase susceptibility of the object detection circuit 402 to instability in the sense circuits 404a, 404b, and 404n e.g., due to temperature variation of some electrical and mechanical characteristics (e.g., micro-movements of the sense coil array 106 relative to the wireless power transfer structure 224 (see FIG. 2A).

In another aspect, omitting the output multiplexer (plurality of switches 422) may not allow an object 110 to be localized by exploiting spatial resolution inherent to an object detection circuit 402 using an array of sense coils (405a, 405b, 405n). Spatial resolution may be needed for an object detection circuit integrated in a WEVC system e.g., for discriminating the effect of the metallic vehicle underbody (large object) from an object 110 that is potentially susceptible to induction heating.

In some alternative implementations omitting at least an output multiplexer, the loss in SNR, fractional voltage change $\Delta V/V_0$, and spatial resolution is avoided by intentionally tuning each of the plurality of sense circuits 404a, 404b, 404n on a substantially different resonant frequency sufficiently spaced apart (e.g., 200 kHz), and by smartly controlling the sense frequency so that only one of the plurality of sense circuits 404a, 404b, 404n is operated at resonance at a time. Such implementations however may not allow the change $\Delta Z$ as caused by an object 110 to be determined with sufficient accuracy, since the parallel connection of the N−1 detuned (undesired) sense circuits (e.g. 404b, 404n) may substantially perturb the complex impedance associated to the desired sense circuit (e.g. 404a). This impedance perturbance may get even more severe, if the effect of the shunt inductor 434 creating a parallel resonance (e.g., around 2 MHz) and mutual inductive coupling (cross-coupling) among sense coils of the plurality of sense coils 405a, 405b, and 405n is taken into account. Furthermore, depending on the number N, such implementations may require a relatively broad operating frequency range (e.g., 3-6 MHz) to provide sufficient spacing of resonant frequencies, which may be considered disadvantageous by various reasons not discussed herein.

Figure 5:
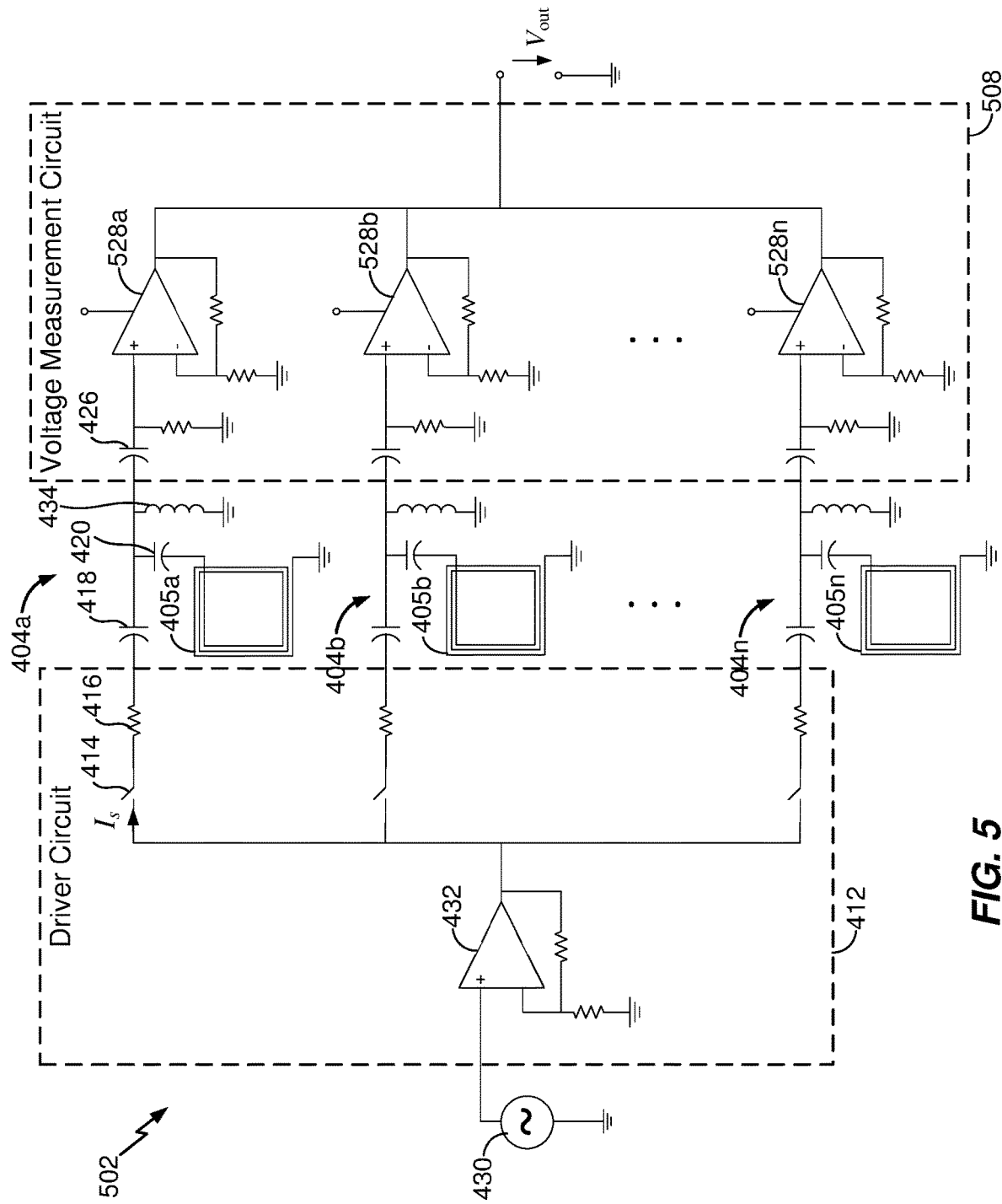
FIG. 5 illustrates a schematic view of an example of another implementation of a portion of an object detection circuit based on a voltage measurement approach.

FIG. 5 illustrates a schematic view of an example of another implementation of a portion of an object detection circuit 502 based on a voltage measurement approach. The object detection circuit 502 includes a similar driver circuit 412 and sense circuit configuration (e.g., sense coil 405a etc. and series capacitor 420) and other similar components as described with reference with the object detection circuit 402 of FIG. 4. The object detection circuit 502 illustrates one improvement over the object detection circuit 402 of FIG. 4. In FIG. 5, the voltage measurement circuit 508 includes a plurality of low noise voltage measurement amplifiers 528a, 528b, and 528n (e.g., operational amplifiers) electrically connected to each corresponding sense circuit 404a, 404b, and 404n. The outputs of each of the low noise voltage measurement amplifiers 528a, 528b, and 528n are directly combined to form a common output. This configuration removes the need for an output multiplexer. Instead, the multiplexer function is accomplished using low noise voltage measurement amplifiers 528a, 528b, and 528n that are configured to be selectively muted based on one or more control signals (e.g., by changing a logical level at the mute control input). Muting an amplifier creates a high impedance zero-voltage output allowing the outputs of the N amplifiers to be combined without output voltage conflict and summation of noise due to the other N−1 amplifiers (e.g., 528b and 528n) connected to the deselected sense circuits (e.g., 404b, 404n).

The circuit shown in FIG. 5 may provide high performance in terms of detection sensitivity, accuracy, thermal stability, and false detection rate but requires considerably (N−1) more low noise measurement amplifiers 528a, 528b, and 528n than the object detection circuit 402 of FIG. 4 resulting in a significant increase of complexity and cost for the object detection circuit 502, if N is large. As such, it may be desirable to have an alternative solution with similar or marginally lower performance but significantly reduced complexity and cost.

Current Measurement Approach

Figure 6:
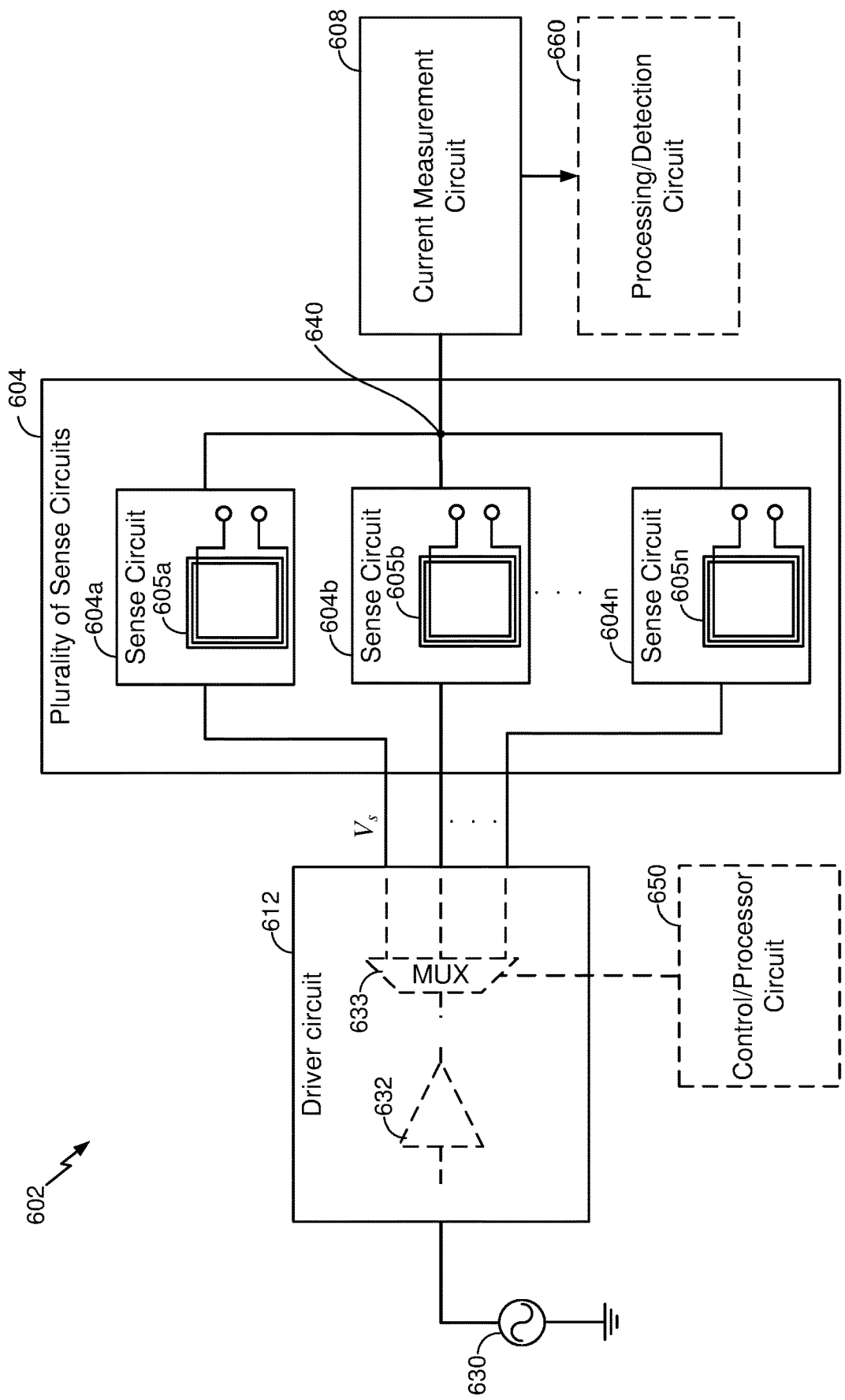
FIG. 6 illustrates a schematic view of an example of an implementation of a portion of an object detection circuit based on a current measurement approach.

FIG. 6 illustrates a schematic view of an example of an implementation of a portion of an object detection circuit 602 based on a current measurement approach (e.g., see description relative to FIG. 3D).

The object detection circuit 602 (e.g., an apparatus) includes a plurality of sense circuits 604a, 604b, and 604n (represented together by the plurality of sense circuits 604). Each of the plurality of sense circuits 604a, 604b, and 604n includes a corresponding sense coil 605a, 605b, and 605n. The object detection circuit 602 includes a driver circuit 612 electrically connected to the plurality of sense circuits 604a, 604b, and 604n. The driver circuit 612 is configured to operate as a voltage source and selectively (e.g., sequentially) apply a voltage signal at an operating frequency to each of the plurality of sense circuits 604a, 604b, and 604n. For purposes of measuring an impedance, the signal source may generate a sinusoidal voltage $V_s$ with a defined amplitude and phase at an operating frequency.

In certain implementations, operation as a voltage source may be characterized by a quasi-ideal voltage source operation. In this case, the driver circuit 612 is configured to operate as a quasi-ideal voltage source defined above that may be described as a sinusoidal signal source with a sufficiently small (but non-zero) source impedance so that the magnitude of the fractional change of its output voltage $|\Delta V/V_{s,0}|$ is at least a factor of 10 smaller than the magnitude of the fractional change of its output current $|\Delta I/I_0|$, where $\Delta V$ and $\Delta I$ denote the change in complex amplitude (magnitude and phase) of its output voltage and current, respectively, due to presence of an object (e.g. object 110) and $V_{s,0}$ and I the complex amplitude of its output voltage and current, respectively, in absence of the object. As such, changes in impedance of the sense circuits (e.g., 604a) of the plurality of sense circuits 604a, 604b, and 604n resulting in changes of electrical current the respective circuits (e.g., 604a) have a substantially negligible impact on the output voltage $V_S$ of the driver circuit 612. In an aspect, therefore, the driver circuit 612 may be configured such that changes in loading presented to the driver circuit do not have an impact on its output voltage $V_S$ (e.g., the output of the driver circuit mimics a quasi-ideal voltage source).

The plurality of sense circuits 604a, 604b, and 604n are each electrically connected to a common output node 640. Using the current measurement approach, the current outputs of the plurality (N) of sense circuits 604a, 604b, and 604n may be combined at the common output node 640 that is electrically connected to a current measurement circuit 608. The current measurement circuit 608 is configured to provide a measurement output $V_{out}$ proportional to an electrical current at the common output node 640. In certain implementations or operations, the current at the common output node 640 is an electrical current in at least one of the plurality of sense circuits 604a, 604b, and 604n in response to the voltage signal being applied to the at least one of the plurality of sense circuits 604a, 604b, and 604n. In other implementations or operations, the current at the common output node 640 is the sum of electrical current in one or more of the plurality of sense circuits 604a, 604b, and 604n in response to the voltage signal being applied to the one or more of the plurality of sense circuits 604a, 604b, and 604n.

A processing/detection circuit 660 electrically connected to an output of the current measurement circuit 608 is shown for illustrative purposes to indicate the further processing but is not critical for explanation of the implementation shown in FIG. 6. The processing/detection circuit 660 is configured to provide further signal processing and is configured to determine whether an object is present based on the measurement output proportional to the electrical current $I_0+\Delta I$ at the common output node 640 that may relate to an impedance as defined by Equation 3.

As described above, the driver circuit 612 is configured to operate as a voltage source (e.g., characterized by a quasi-ideal voltage source) and selectively (e.g., sequentially) apply a voltage signal at an operating frequency to each of the plurality of sense circuits 604a, 604b, and 604n. For purposes of measuring an impedance, the signal source may generate a sinusoidal voltage $V_s$ with a defined amplitude and phase. In one operational example, one sense circuit of the plurality of sense circuits 604a, 604b, and 604n is driven at a time. To accomplish selective driving of each sense circuit 604a, 604b, and 604n, the driver circuit 612 may include components such as an amplifier circuit 632 and a multiplexer circuit 633. The amplifier circuit 632 is configured to provide an amplifier output suitable for driving at least one of the sense circuits 604a, 604b, and 604n based on a signal received from a signal source 630. The multiplexer 633 may be electrically connected between the amplifier's 632 output and the plurality of sense circuits 604a, 604b, and 604n and is configured to selectively connect each of the plurality of sense circuits 604a, 604b, and 604n to the amplifier's 632 output. The dashed lines of the amplifier circuit 632 and multiplexer emphasize these components are illustrative and other implementations may have these or other components configured to selectively drive the plurality of sense circuits 604a, 604b, and 604n with a sense signal. Furthermore, while certain circuit elements are described as connected between other elements it should be appreciated that there may be other circuit elements in various implementations that may also be in between the two elements described as electrically connected (e.g., other elements interposed).

The driver circuit 612 may be electrically connected to a control/processor circuit 650 which may be the same as or different form the processing/detection circuit 660. The control/processor circuit 650 is configured to apply one or more control signals to the driver circuit (e.g., to switches of a multiplexer circuit 633) to cause selective connection of the amplifier circuit 632 to each of the plurality of sense circuits 604a, 604b, and 604n or otherwise control parameters of the amplifier circuit 632 or control the general operation of the driving circuit 612 during the object detection process. The control/processor circuit 650 is shown for illustrative purposes to indicate the further control signals but is not critical for explanation of the implementation shown in FIG. 6.

As described above with reference to the measurement and detection circuit 108 of FIG. 1, at least a portion of the control/processor circuit 650 and/or the processing/detection circuit 660 may be implemented by one or more microcontrollers or processors. This portion may be implemented as an application-specific integrated circuit (ASIC), and field programmable gate array (FPGA) device, digital signal processor (DSP), or another processor device. The control/processor circuit 650 and/or the processing/detection circuit 660 may be configured to receive information from each of the components of the object detection circuit 602 and perform calculations based on the received information. The control/processor circuit 650 and/or the processing/detection circuit 660 may be configured to generate control signals for each of the components that may adjust the operation of that component. The control/processor circuit 650 and/or the processing/detection circuit 660 further may further include a memory (not shown) configured to store data, for example, such as instructions for causing the measurement and detection circuit 602 to perform particular functions, such as those related to object detection.

In the implementation of the object detection circuit 402 with reference to FIG. 4, there may be (depending on the number N of sense circuits 404a, 404b, and 404n) a substantial reduction of detection sensitivity and impedance measurement accuracy, if the output of the plurality of sense circuits 404a, 404b, and 404n are connected in parallel to the input of the shared voltage measurement circuit 408 by various reasons as previously discussed.

Figure 7:
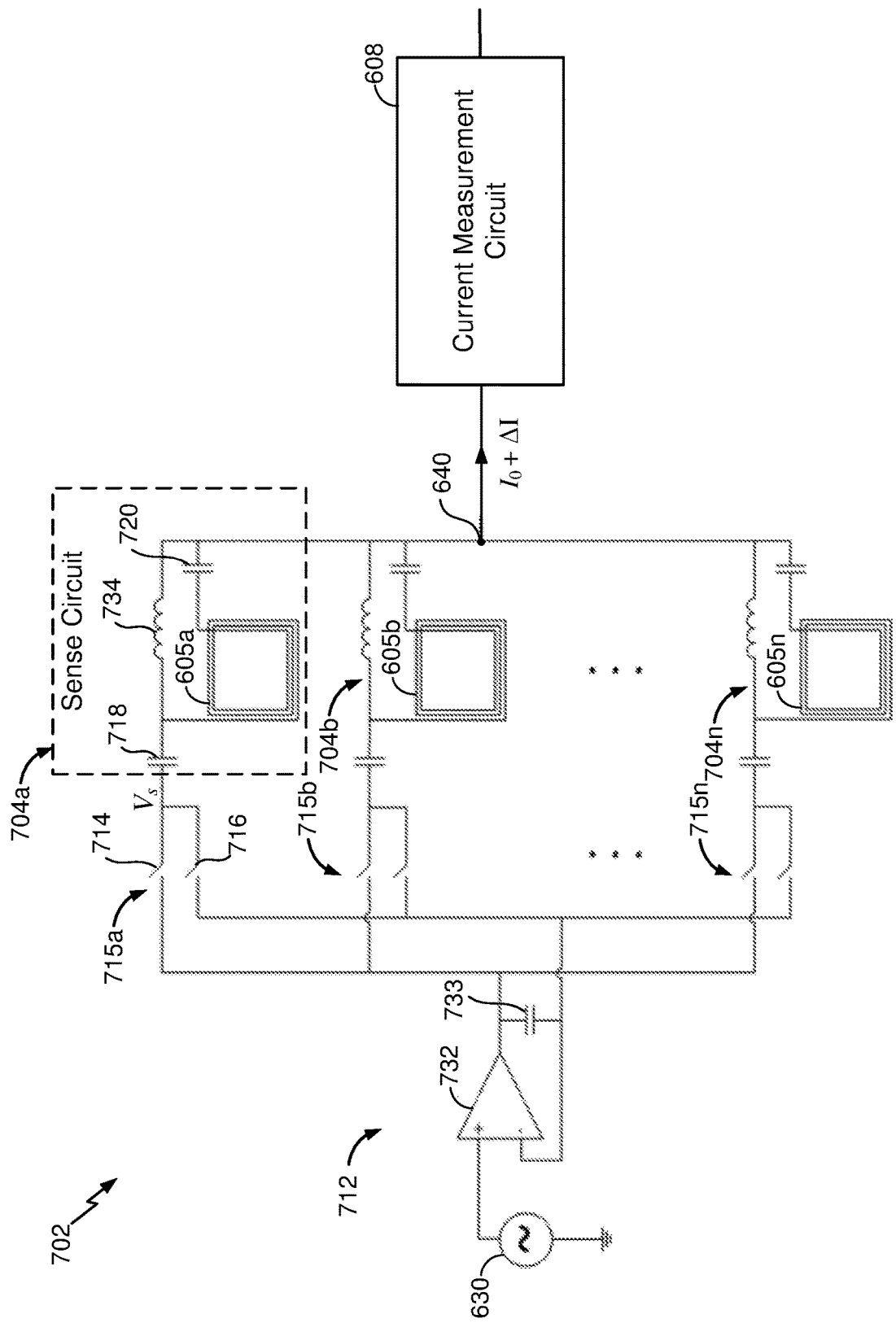
FIG. 7 illustrates a schematic view of an example of a more particular implementation of a portion of an object detection circuit based on the object detection circuit of FIG. 6.

Because the object detection circuit 602 of FIG. 6 employs a current measurement circuit 608, and if only one sense circuit 604a is electrically connected to driver circuit 612 (e.g., via the multiplexer 633), then little or ideally no current will flow in the other deselected sense circuits 104a (despite the presence of the induced voltages e.g., voltages induced by the wireless power magnetic field). Voltages induced on the other sense circuits 604b and 604n will therefore have little impact on the measurement of current in the selected sense circuit 604a as only little or ideally no current can flow in the other deselected sense circuits 604b and 604n towards the common output node 640. This becomes more evident below when contemplating FIG. 7 illustrating a more particular implementation of a portion of an object detection circuit 602. Therefore, the outputs can be connected to a common output node 640 and the same current measurement circuit 608 is used for each of the plurality of sense circuits 604a, 604b, and 604n. This reduces complexity and saves cost by reducing the number of components.

In one example implementation, the object detection circuit 602 may be integrated into an inductive wireless power system. In this case each sense coil 605a, 605b, and 605n of the plurality of sense circuits 604a, 604b, and 604n is positioned to be spatially distributed over a predetermined area at least partially defined by a wireless power transmit coil 226 (FIG. 2) configured to inductively transfer power. A change in the electrical current in at least one of the plurality of sense circuits 604a, 604b, and 604n is indicative of a presence of an object in proximity to the at least one of the plurality of sense coils 605a, 605b, and 605n. In some implementations, the wireless transmit coil 226 (FIG. 2) is part of a WEVC system. The frequency of a wireless power magnetic field configured to be generated by the transmit coil 226 is at a frequency different from the operating frequency of the object detection circuit 602. For example, the wireless power frequency may be on the order of kilohertz (e.g., 85 kHz) and the operating frequency of the object detection circuit 602 may be on the order of megahertz (e.g., around 3 MHz).

As noted above, the object detection of circuit 602 of FIG. 6 is based on a current measurement approach where the driver circuit 612 is configured to operate as a voltage source (e.g., a quasi-ideal voltage source) and apply a voltage signal at an operating frequency to each of the plurality of sense circuits 604a, 604b, and 604n (e.g., in other words, the driver circuit is configured to mimic an ideal voltage source). For purposes of measuring an impedance, the signal source may generate a sinusoidal voltage $V_s$ with a defined amplitude and phase at an operating frequency FIG. 7 illustrates a schematic view of an example of a more particular implementation of a portion of an object detection circuit 702 based on the object detection circuit 602 of FIG. 6. The object detection circuit 702 includes an implementation of a driver circuit 712 configured to operate as a voltage source. The driver circuit 712 includes an amplifier 732 (e.g., operational amplifier) having a first amplifier input, a second amplifier input, and an amplifier output. The first amplifier input is configured to receive an input signal (e.g., a sinusoidal signal) (e.g., from the signal source 630). The driver circuit 712 further includes a plurality of switch circuits 715a, 715b, and 715n. Each of the plurality of switch circuits 715a, 715b, and 715n is electrically connected between the amplifier 732 and a respective sense circuit (e.g. 704a) of the plurality of sense circuits 704a, 704b, and 704n. Each of the plurality of switch circuits 715a, 715b, and 715n includes a first switch 714 electrically connected between the amplifier output of the amplifier 732 and the respective one (e.g., sense circuit 704a) of the plurality of sense circuits 704a, 704b, and 704n. Each of the plurality of switch circuits 715a, 715b, and 715n also includes a second switch 716 electrically connected between the second amplifier input and the respective sense circuit (e.g., 704a) of the plurality of sense circuits 704a, 704b, and 704n. The plurality of switch circuits 715a, 715b, and 715n may form an analog multiplexer configured as a double switch input multiplexer which is also used to compensate for voltage drop across a switch resistance of the switch 714 between the amplifier output and each of the plurality of sense circuits 704a, 704b, and 704n. The electrical path that is created when switch 716 is closed is referred to as the voltage feedback path of the driver circuit 712. This feedback path may be provided to compensate for the voltage drop across the switch 714 and thus behave as a voltage source (e.g., quasi-ideal voltage source) to be able to provide a voltage signal at an operating frequency at the input of the selected sense circuit (e.g., 704a) of the plurality of sense circuits 704a, 704b, and 704n.

A control circuit (not shown in FIG. 7 but shown as control/processor circuit 650 in FIG. 6) may be included and configured to apply control signals to the plurality of switch circuits 715a, 715b, and 714n including the first switch 714 and the second switch 716 to cause each of the plurality of sense circuits 704a, 704b, and 704n to be electrically connected selectively (e.g., sequentially) to the amplifier 732 output. In one example operation, only one of the plurality of sense circuits 704a, 704b, and 704n is driven at a time by closing the corresponding switches 714 and 716 which electrically connects the low noise driver amplifier 732 to the selected sense circuit.

As noted above, each switch 714 and 716 of the plurality of switch circuits 715a, 715b, and 714n may exhibit a switch resistance (e.g. 4Ω) causing a voltage drop across the switch 714 (e.g., of switch circuit 715a) when current flows to the respective sense circuit (e.g., 704a). Without compensation, this voltage drop that may be generally unspecified due to an unspecified switch resistance that may also vary with temperature and current level may conflict with the desirability of applying a sense signal source characterized by a voltage source (e.g., a quasi-ideal voltage source) at the selected sense circuit (e.g., 704a). The object detection circuit 702 includes an amplifier 732 (e.g., in a unity gain configuration and configured to produce low noise at its output) and the plurality of switch circuits 715a, 715b, 715n forming a double switch input multiplexer. As described above, the first switch 714 electrically connects the output of the amplifier 732 to the selected sense circuit (e.g., 704a). The second switch 716 of the switch circuit (e.g., 715a) provides a virtually zero current feedback path from the selected sense circuit (e.g., 704a) to the second (e.g., negative) input of the amplifier 732. It may be appreciated that this circuit configuration compensates for the voltage drop across the first switch 714. In an aspect, an input impedance at the second input of amplifier 732 is sufficiently high and a parasitic capacitance towards ground (not shown in FIG. 7) of the second switch 716 of the switch circuit (e.g., 715a) is sufficiently low to cause electrical current flowing through the second switch 716 of switch circuit (e.g., 715a) to be negligible or substantially zero. In another aspect, based on the feedback at the second (e.g., negative) input of amplifier 732 via the second switch 716 of switch circuit (e.g., 715a), the amplifier 732 is configured to adjust its output voltage level to compensate for a voltage drop across a switch resistance of the first switch 714 of the respective switch circuit (e.g., 715a). In practice, the voltage drop may not be fully compensated for due to the effect of parasitic switch capacitance as mentioned above. In yet another aspect, a shunt capacitor 733 is added to ensure stability (with respect to self-oscillation) of the amplifier 732 at high frequencies. It shall be also noted that this amplifier 732 may have to drive a significant capacitive load as resulting from the summation of the parasitic capacitance of each of the plurality of switch circuits 715a, 715b, and 715n. This shunt capacitor 733 may somewhat compromise the accuracy of the voltage source as presented (mimicked) at the selected sense circuit (e.g., 704a). Therefore, its capacitance value (e.g. 100 pF) may be the result of a trade-off.

As a result of the configuration of the driver circuit 712, the driver circuit 712 is able to operate as a voltage source (e.g., a quasi-ideal voltage source) and selectively apply a voltage signal at an operating frequency to each of the plurality of sense circuits 704a, 704, and 704n to enable determining an electrical characteristic (e.g., the impedance) based on the sensitive current measurement and without further sensitive voltage measurements.

As an additional description of the object detection circuit 702, the plurality of sense circuits 704a, 704b, and 704n may include at least a first sense circuit 704a and a second sense circuit 704b. The driver circuit 712 includes an amplifier 732 having a first amplifier input, a second amplifier input, and an amplifier output where the first amplifier input is configured to receive a signal (e.g., a sinusoidal signal). The driver circuit 712 includes a first switch 714 of a first switch circuit 715a electrically connected between the amplifier output and the first sense circuit 704a. The driver circuit 712 further includes a second switch 716 of a first switch circuit 715a electrically connected between the first sense circuit 704a and the second amplifier input. The driver circuit 712 further includes a first switch 714 of a second switch circuit 715b electrically connected between the amplifier output and the second sense circuit 704b. The driver circuit 712 further includes a second switch 716 of a second switch circuit 715b electrically connected between the second sense circuit 704b and the second amplifier input.

Each of the plurality of sense circuits 704a, 704b, and 704n includes a corresponding sense coil 605a, 605b, and 605n. Each of the plurality of sense circuits 704a, 704, and 704n includes a first capacitor 720 (e.g., tuning capacitor) electrically connected in series to the corresponding sense coil 605a to form a resonant circuit configured to resonate substantially at or near the operating frequency of the object detection circuit 702 (e.g., around 3 MHz).

In some implementations, the first capacitor 720 in each of the plurality of sense circuits 704a, 704b, and 704n may be a capacitor with a low temperature coefficient providing high thermal stability (e.g., a NP0-type capacitor) reducing thermal drift of an electrical characteristic (e.g., an impedance) as measured at each of the plurality of sense circuits 704a, 704, and 704n.

Furthermore, in certain implementations, each of the plurality of sense circuits 704a, 704b, and 704n includes a second capacitor 718 (e.g., a DC block capacitor) shown in FIG. 7 as inserted between the respective output of driver circuit 712 and the series circuit of the respective sense coil (e.g., 605a) of the plurality of sense coils 605a, 605b, and 605n and capacitor 720, but may be also inserted between node 640 and the series circuit of the respective sense coil (e.g., 605a) and capacitor 720. This second capacitor 718 has a similar function as described above with respect to the capacitor 418 of FIG. 4.

Furthermore, in certain implementations, each of the plurality of sense circuits 704a, 704b, and 704n includes a shunt inductor 734 electrically connected in parallel to (across) the series circuit of the respective sense coil (e.g., 605a) of the plurality of sense coils 605a, 605b, and 605n and capacitor 720. In implementations involving the inductive wireless power transfer system, the shunt inductor 734 is part of a high pass filter configured to attenuate voltages induced into the sense coil (e.g., 605a of the plurality of sense coils 605a, 605b, and 605n at a wireless power frequency different than the operating frequency of the object detection circuit 702.

The object detection circuit 702 includes a current measurement circuit 608 as described with reference to FIG. 6 and configured to measure the electrical current $I_0+\Delta I$ at the common output node 640. In certain implementations, this current is effectively the current flowing through the selected sense circuit (e.g., 705a) in presence of an object (e.g., object 110).

Figure 8:
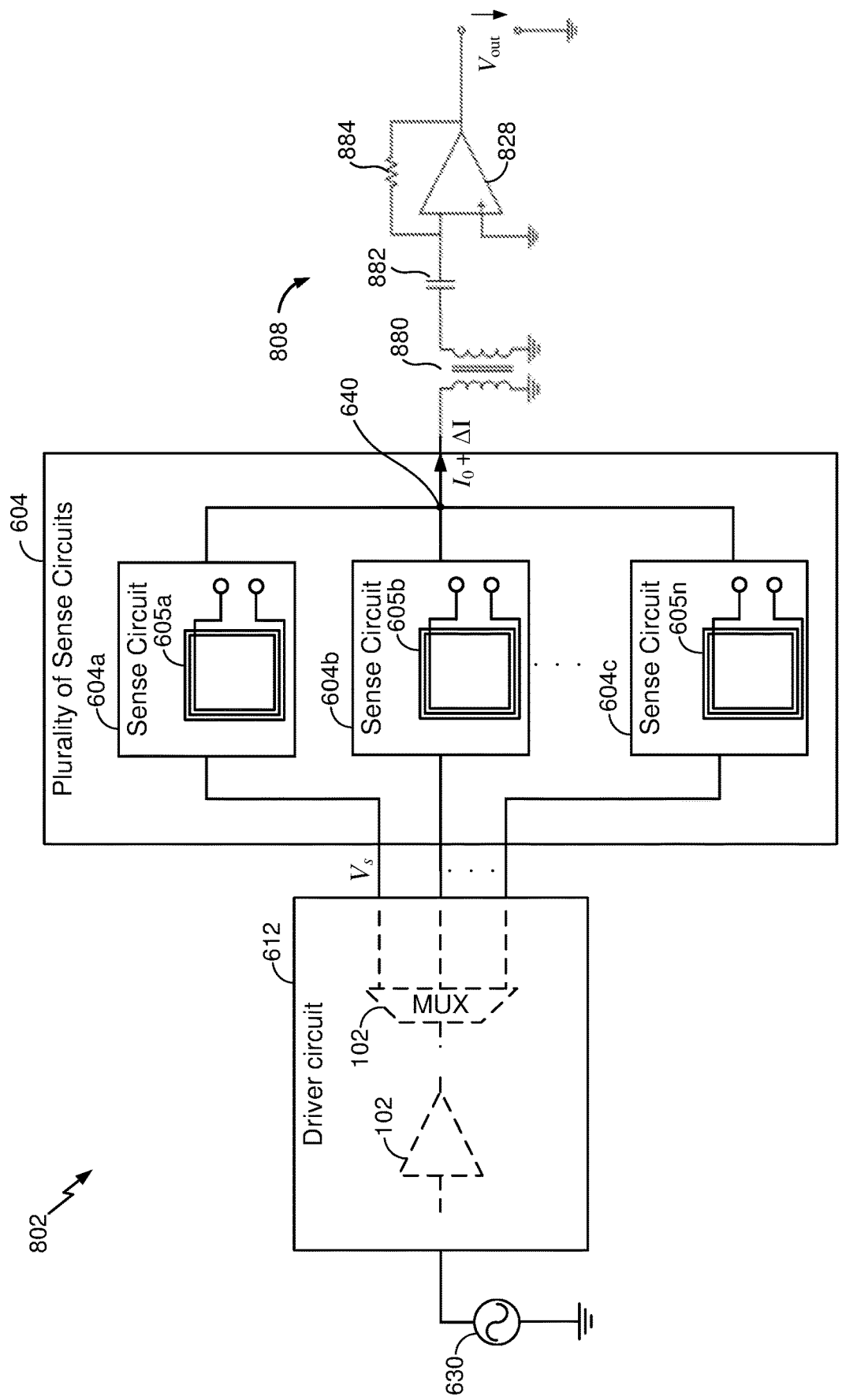
FIG. 8 illustrates a schematic view of an example of a more particular implementation of a portion of an object detection circuit based on the object detection circuit of FIG. 6.

FIG. 8 illustrates a schematic view of an example of a more particular implementation of a portion of an object detection circuit 802 based on the object detection circuit 602 of FIG. 6. The current measurement circuit 808 of FIG. 6 includes a measurement amplifier 828 (e.g., operational amplifier) configured to output an electrical characteristic (e.g., voltage) that is proportional to the electrical current in at least one of the plurality of sense circuits 604a, 604b, and 604n. The measurement amplifier 828 is configured to be a low noise current measurement amplifier including the feedback resistor 884. In one implementation, the amplifier 828 is configured as a transimpedance amplifier (e.g., or some circuit configured to convert current into a voltage) and is configured to provide an output voltage $V_{out}$ that is proportional to an electrical current $I_0+\Delta I$ at the common output node 640.

In some implementations, the output voltage level $V_S$ of the driver circuit 612 may be adjusted to drive the selected sense circuit (e.g., 605a) of the plurality of sense circuits 604a, 604b, 604n with a sense current level in the order of 30 $mA_{rms}$. Injecting a current of 30 $mA_{rms}$ directly into the amplifier 828 would require a relatively low feedback resistance (<50Ω) given an amplifier output voltage constraint (e.g., $V_{out}$<1 $V_{rms}$). However, a low feedback resistance generally involves a risk for instability (self-oscillation) at high frequencies. As such, in one implementation, the instability issue may be remedied with little impact on the noise performance by using a current transformer 880 (e.g., with a turns ratio on the order of 1:10) providing the amplifier 828 with a current in the mA range (e.g., the current transformer 880 is configured to transform a level of current at an input of the measurement circuit 808 to a lower level at an input of the amplifier 828. As such, the feedback resistor 884 can be chosen on the order of a higher resistance (e.g. 10-times higher) that allows for more choices e.g., for commercially available low noise operational amplifiers.

The current transformer 880 may have other advantages. For example, if the current transformer 880 is designed for a relatively low secondary inductance (e.g. 10 uH), the current transformer 880 additionally suppresses low frequency components (e.g., emanating from the wireless power transfer system e.g., 85 kHz and harmonics thereof) as inductively and/or capacitively coupled into the sense coils (605a, 605b, and 605n). Moreover, in some implementations, the current transformer 880 potentially reduces ground loop effects since primary and secondary winding may be grounded at different points. In further implementations, separate grounds for the sense circuits 604a, 604b, and 604n, and for the amplifier 828 may be used. In such implementations, the transformer 880 may provide full galvanic decoupling of the sense coils 605a, 605b, and 605n from the amplifier 828.

A capacitor 882 may be inserted between current transformer 880 and amplifier 828 to block any DC component and to provide additional attenuation of low frequency signal components as shown in FIG. 8.

Figure 9:
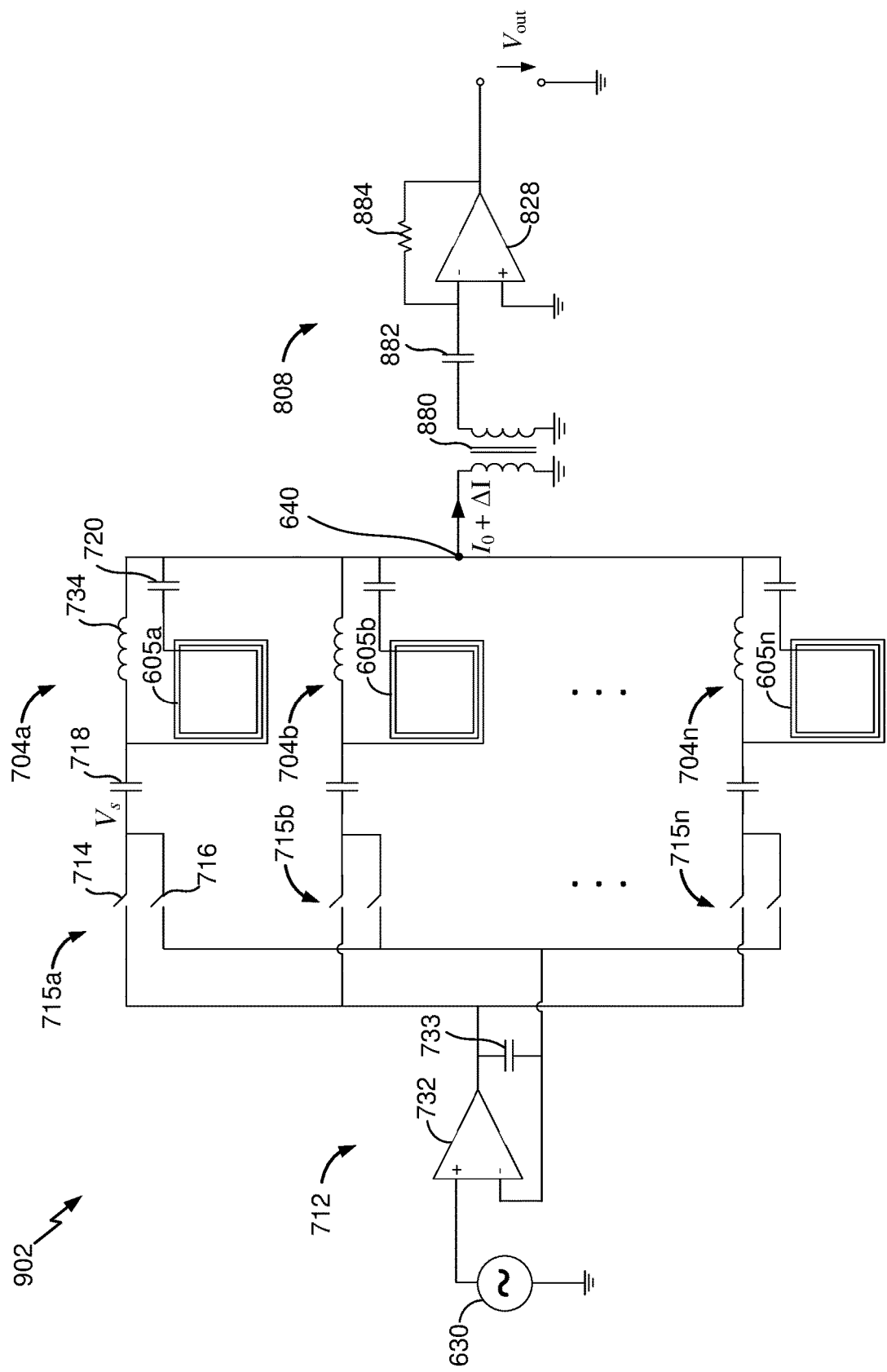
FIG. 9 illustrates a schematic view of an example of a more particular implementation of a portion of an object detection circuit based on the object detection circuit of FIG. 6.

FIG. 9 illustrates a schematic view of an example of a more particular implementation of a portion of an object detection circuit 902 based on the object detection circuit 602 of FIG. 6. The object detection circuit 902 includes aspects of both FIG. 7 and FIG. 8.

The object detection circuit 902 includes a plurality of sense circuits 704a, 704b, and 704n each comprising a sense coil 605a, 605b, and 605n. The plurality of sense circuits 704a, 704b, and 704n are each electrically connected to a common output node 640. The object detection circuit 902 includes a driver circuit 712 electrically connected to the plurality of sense circuits 704a, 704b, and 704n and configured to operate as a voltage source (e.g., corresponding to a quasi-ideal voltage source operation) and selectively apply a voltage signal at an operating frequency to each of the plurality of sense circuits 704a, 704b, and 704n. For purposes of measuring an impedance, the signal source may generate a sinusoidal voltage $V_s$ with a defined amplitude and phase at an operating frequency. The object detection circuit 902 includes a current measurement circuit 808 electrically connected to the common output node 640 of the plurality of sense circuits 704a, 704b, and 704n. The current measurement circuit 808 is configured to provide a measurement output $V_{out}$ proportional to an electrical current $I_0+\Delta I$ at the common output node 640.

While not shown in FIG. 9 there may be a detection circuit (e.g., processing/detection circuit 660 of FIG. 6) electrically connected to the current measurement circuit 808 and configured to determine whether an object is present based on the measurement output $V_{out}$ proportional to the electrical current $I_0+\Delta I$ at the common output node 640.

The driver circuit 712 includes an amplifier 732 having a first amplifier input, a second amplifier input, and an amplifier output. The first amplifier input is configured to receive a signal (e.g., a sinusoidal signal) e.g., from a signal source 630. The driver circuit 712 includes a plurality of a switch circuits 715a, 715b, and 715n where each of the plurality of switch circuits 715a, 715b, and 715b is electrically connected between the amplifier 732 and a respective sense circuit (e.g., 704a) of the plurality of sense circuits 704a, 704b, and 704n. Each of the plurality of switch circuits 715a, 715b, and 715b includes a first switch 714 electrically connected between the amplifier output of the amplifier 732 and the respective sense circuit (e.g., 704a) of the plurality of sense circuits 704a, 704b, and 704n. Each of the plurality of switch circuits 715a, 715b, and 715b further includes a second switch 716 electrically connected between the respective sense circuit (e.g., 704a) of the plurality of sense circuits 704a, 704b, and 704n and the second amplifier input.

While not shown in FIG. 9 there may be a control circuit (e.g., control/processor circuit 650 of FIG. 6) configured to apply control signals to the first switch 714 and the second switch 716 (and other switches in each sense coil branch) to cause each of the plurality of sense circuits 704a, 704b, and 704n to be selectively (e.g., sequentially) electrically connected to the amplifier output.

The driver circuit 712 may further include a capacitor 733 electrically connected between the amplifier output and the second amplifier input.

Each of the plurality of sense circuits 704a, 704b, and 704n includes a first capacitor 720 electrically connected in series to the sense coil 605a to form a resonant circuit configured to resonate substantially near an operating frequency.

Each of the plurality of sense circuits 704a, 704b, and 704n further includes a second capacitor 718 electrically coupled between the driver circuit 712 and a respective series circuit of sense coil (e.g., 705a) of each of the plurality of sense circuits 704a, 704b, and 704n and capacitor 720. Each of the plurality of sense circuits 704a, 704b, and 704n includes a shunt inductor 734 electrically connected in parallel to (across) the series circuit of sense coil (e.g., 705a) of each of the plurality of sense circuits 704a, 704b, and 704n and capacitor 720.

The measurement circuit 808 includes a current transformer 880, a capacitor 882, an amplifier 828 and a feedback resistor 884. The current transformer 880 includes a primary winding and a secondary winding, the primary winding electrically connected to the common output node 640 and the secondary winding connected to the capacitor 882. The capacitor 882 is electrically connected between the secondary winding of the current transformer 880 and the first input of the amplifier 828. The amplifier 828 has a first input electrically connected to the capacitor 882 and a second input electrically connected to a ground reference. The feedback resistor 884 is electrically connected between the first input and the output of amplifier 828. The amplifier 828 is configured to output a measurement output as a voltage $V_{out}$ that is proportional to the secondary current of the current transformer 880, that is in turn proportional to an electrical current $I_0+\Delta I$ at the common output node 640.

As described above, the object detection circuit 902 of FIG. 9 may be integrated into a wireless power transfer circuit 220 (see FIG. 2A). In this implementation, the plurality of sense coils 605a, 605b, and 605n may be distributed over a predetermined area at least partially defined by a wireless power transmit coil 226 (FIG. 2A) configured to inductively transfer power. A change in the electrical current (magnitude and/or phase) in at least one of the plurality of sense circuits 704a, 704b, and 704n is indicative of a presence of an object in proximity in the at least one of the plurality of sense coils 605a, 605b, and 605n. The frequency of a magnetic field generated by the wireless power transmit coil 226 may be at a frequency different than the operating frequency of the object detection circuit 902. For example, the wireless power frequency may be on the order of kilohertz (e.g., 85 kHz) and the operating frequency of the object detection circuit 902 may be on the order of megahertz (e.g., 3 MHz).

The object detection circuit 902 may provide similar performance as compared to the voltage measurement approach of FIG. 5 but may have a lower complexity and cost.

If the object detection circuit 902 is not integrated into a system with another high strength magnetic field such as an inductive wireless power transfer system, various of the components shown in FIG. 9 may be optional. For example, the shunt inductor 734 and the second capacitor 718 may be optional. In addition, in the measurement circuit 808, the capacitor 882 connected between the current transformer 880 and the amplifier 828 may be optional. In addition, in some implementations the current transformer 880 may be optional based on the level of current to be measured and type of amplifier 828. In addition, there may be different configurations for the resonant circuit of the sense circuit 604a (e.g., parallel or series-parallel tuned) and in some implementations a non-resonant sense circuit may be used (e.g., use just the sense coil 605a without a corresponding first (tuning) capacitor 720).

Figure 10:
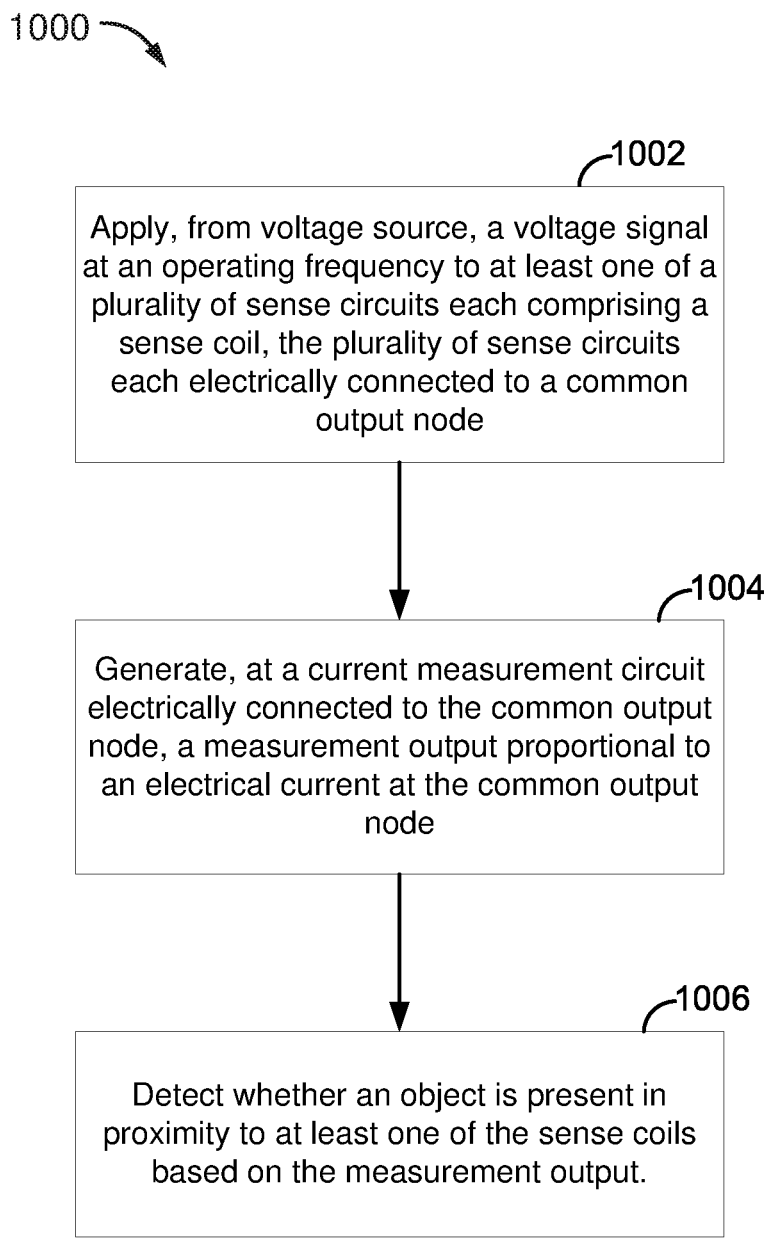
FIG. 10 is a flow diagram illustrating an example of a method for measuring changes in current for detecting objects.

FIG. 10 is a flow diagram illustrating an example of a method 1000 for measuring changes in current for detecting objects. The method 1000 is described with reference to FIG. 6, however the techniques described may be implemented using any of the previously described elements of the example environment, components, or circuits. Reference to elements is made by example only and is not intended to limit the ways in which the techniques can be implemented. The depicted sets of operations illustrate a few of the many ways in which the techniques may be implemented. As such, operations of a method may be repeated, combined, separated, omitted, performed in alternate orders, performed concurrently, or used in conjunction other methods illustrated in FIG. 10 and other flowcharts or operations thereof.

At operational block 1002, the method 1000 includes applying, from a voltage source, a voltage signal at an operating frequency to at least one of a plurality of sense circuits 604a, 604b, and 604n each comprising a sense coil 605a, 605b, and 605n. The plurality of sense circuits 604a, 604b, and 604n each are electrically connected to a common output node 640. The voltage source may correspond to a quasi-ideal voltage source. For example, applying the voltage signal may include maintaining an output wherein changes in electrical impedance of the sense coil 605a, 605b, and 605n of each of the plurality of sense circuits 604a, 604b, and 604n resulting in changes in electrical current in each of the plurality of sense circuits 604a, 604b, and 604n have a substantially negligible impact on the voltage signal. In another aspect, applying the voltage signal may include applying the voltage signal wherein a first magnitude of the fractional change of an output voltage $|\Delta V/V_{s,0}|$ is at least a factor of 10 smaller than a second magnitude of the fractional change of an output current $|\Delta I/I_0|$.

At operational block 1004, the method 1000 further includes generating, at a current measurement circuit 808 electrically connected to the common output node 640, a measurement output proportional to an electrical current at the common output node 640. At operational block 1006, the method 1000 further includes detecting whether an object is in proximity to at least one of the plurality of sense coils 605a, 605b, and 605n based on the measurement output proportional to the electrical current at the common output node 640. As an example, the object detection circuit 602 may be configured to take the plurality of current measurements over different periods of time (e.g., based on a time-division approach) for each of the plurality of sense circuits 604a, 604b, and 604n and is configured to further process to make a determination of whether an object is present within the predetermined detection region due to changes in electrical current.

In some implementations, applying the signal source at operational block 1002 may include applying a set of control signals to a multiplexer 633 (e.g., or control signals to various switches of the multiplexer 633) to connect a first sense circuit 604a to an output of the driver circuit 612. Then at operational block 1004, the method 1000 may more particularly include generating a measurement output proportional to an electrical current at the common output node 640 that may correspond to an electrical current in the first sense circuit 604a. This may repeat for each of the remaining sense circuits 604b and 604n. For example, the method 1000 may include applying the set of control signals to the multiplexer 633 to connect a second sense circuit 604b to the output of the driver circuit 612 and then generate a measurement output proportional to an electrical current at the common output node 640 that may now correspond to an electrical current in the second sense circuit 604b. As an even more particular example, in conjunction with the implementation of the object detection circuit 702 of FIG. 7, aspects of operational block 1004 may include closing the first switch 714 and second switch 716 while opening the other switches of the plurality of switch circuits 715b and 715n are open (e.g., switches 719 and 717 are open) to electrically connect the amplifier output to the sense circuit 604a and so on similarly for the other sense circuits 604b and 604n.

As described above the implementations of the object detection circuits described above may be implemented in the context of an inductive wireless power system, and in particular a wireless electrical vehicle charging system where it may be desirable to detect objects that may experience inductive heating due to the magnetic field used for power transfer.

Figure 11:
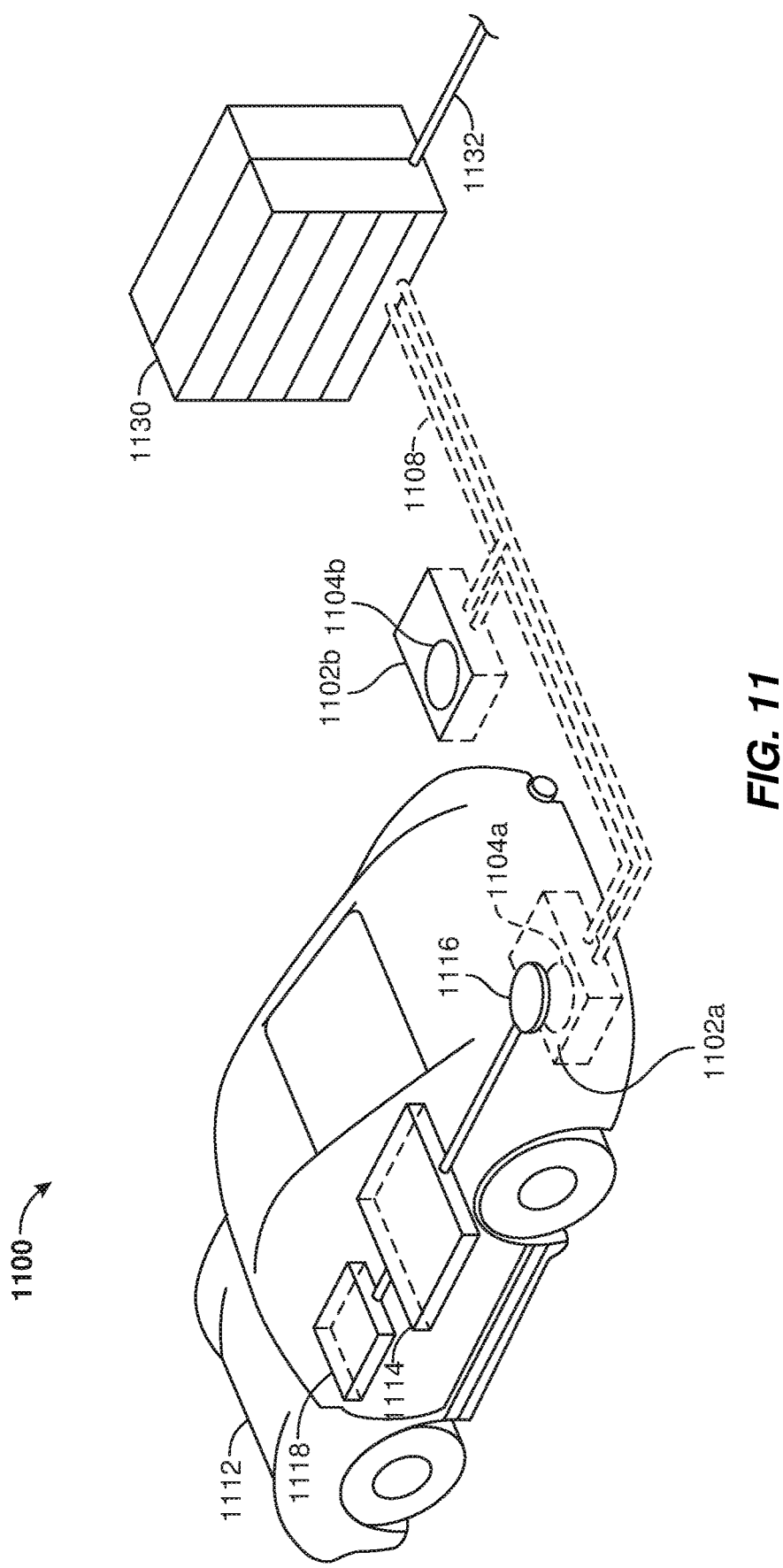
FIG. 11 illustrates a wireless power transfer system for charging an electric vehicle in which any of the elements/functionality described with reference to FIGS. 1-10 may be implemented.

FIG. 11 illustrates a wireless power transfer system 1100 for charging an electric vehicle in which any of the elements/functionality described with reference to FIGS. 1-10 may be implemented.

The wireless power transfer system 1100 enables charging of an electric vehicle 1112 while the electric vehicle 1112 is parked so as to wirelessly couple power from a base wireless charging system 1102a. The base wireless charging system 1102a may correspond to the wireless power transfer circuit 220 as described with reference to FIG. 2A (e.g., and particularly incorporate the wireless power transmit structure 224 shown in FIG. 2B). Spaces for two electric vehicles are illustrated in a parking area to be parked over corresponding base wireless charging systems 1102a and 1102b. In some implementations, a local distribution center 1130 may be connected to a power backbone 1132 and configured to provide an alternating current (AC) or a direct current (DC) supply through a power link 1108 to the base wireless charging systems 1102a and 1102b. Each of the base wireless charging systems 1102a and 1102b also includes a base coil 1104a and 1104b, respectively, for wirelessly transferring power. As described above any of the object detection systems described above with respect to FIGS. 1-9 may be integrated into the base wireless charging systems 1102a and 1102b.

The electric vehicle 1112 may include a battery unit 1118, an electric vehicle coil 1116, and an electric vehicle wireless charging unit 1114. The electric vehicle wireless charging unit 1114 and the electric vehicle coil 1116 constitute the electric vehicle wireless charging system. The electric vehicle wireless charging system may correspond to the wireless power transfer circuit 220 of FIG. 2A (e.g., and particularly incorporate the wireless power receive structure 260 shown in FIG. 2B).

The electric vehicle coil 1116 may receive power when the electric vehicle coil 1116 is located in an electromagnetic field produced by the base coil 1104a. The field may correspond to a region where energy output by the base coil 1104a may be captured by the electric vehicle coil 1116. For example, the energy output by the base coil 1104a may be at a level sufficient to charge or power the electric vehicle 1112.

In some implementations, the electric vehicle coil 1116 may be aligned with the base coil 1104a and, therefore, disposed within a near-field region simply by the electric vehicle operator positioning the electric vehicle 1112 such that the electric vehicle coil 1116 is sufficiently aligned relative to the base coil 1104a.

The base wireless charging system 1102a may be located in a variety of locations. As non-limiting examples, some suitable locations include a parking area at a home of the electric vehicle 1112 owner, parking areas reserved for electric vehicle wireless charging modeled after conventional petroleum-based filling stations, and parking lots at other locations such as shopping centers and places of employment.

Charging electric vehicles wirelessly may provide numerous benefits. For example, charging may be performed automatically, virtually without driver intervention or manipulation thereby improving convenience to a user.

There may also be no exposed electrical contacts and no mechanical wear out, thereby improving reliability of the wireless power transfer system 1100. Safety may be improved since manipulations with cables and connectors may not be needed and there may be no cables, plugs, or sockets to be exposed to moisture in an outdoor environment. In addition, there may also be no visible or accessible sockets, cables, or plugs, thereby reducing potential vandalism of power charging devices. Further, since the electric vehicle 1112 may be used as distributed storage devices to stabilize a power grid, a convenient docking-to-grid solution may help to increase availability of vehicles for vehicle-to-grid (V2G) operation.

Figure 12:
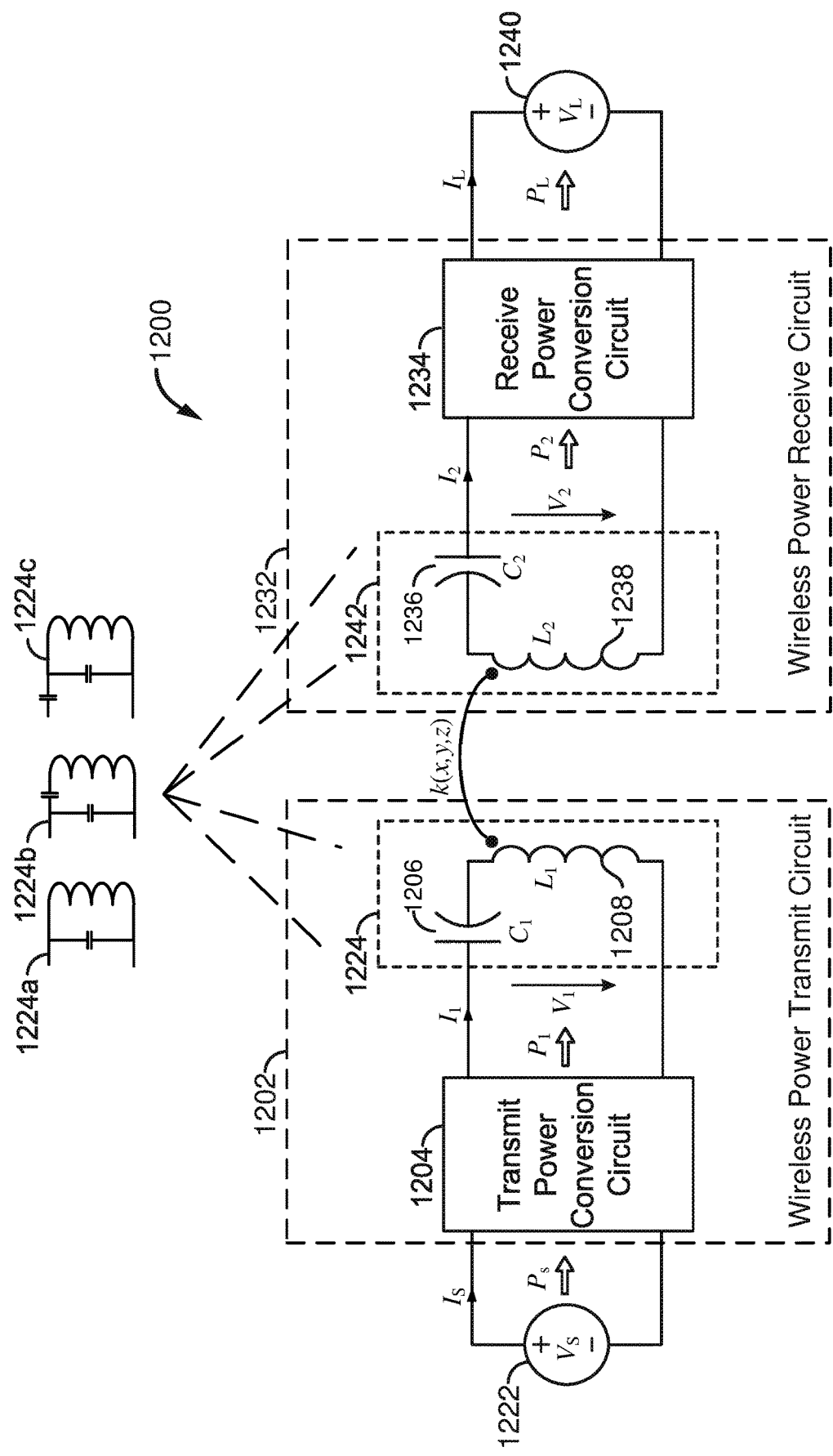
FIG. 12 illustrates a schematic view of an example implementation of the wireless power transfer system of FIG. 11.

FIG. 12 is a schematic view illustrating an example implementation of a wireless power transfer system 1200 that may be a portion of the wireless charging system 1100 of FIG. 11. The wireless power transfer system 1200 of FIG. 12 includes a wireless power transmit circuit 1202. The wireless power transmit circuit includes a transmit resonant circuit 1224 including a transmit coil 1208 having an inductance L1. The transmit coil 1208 may correspond to the wireless power transfer coil 226 with reference to FIG. 2A or 2B.

The wireless power transfer system 1200 further includes a wireless power receive circuit 1232. The wireless power receive circuit 1232 includes a receive resonant circuit 1242 including a receive coil 1238 having an inductance L2. The receive coil 1238 may correspond to the wireless power transfer coil 266 with reference to FIG. 2B. Implementations described herein may use capacitively loaded conductor loops (i.e., multi-turn coils) forming a resonant structure that is capable of more efficiently coupling energy from a primary structure (transmitter) to a secondary structure (receiver) via a magnetic or electromagnetic near-field (e.g., where both the transmit resonant circuit 1224 and the receive resonant circuit 1242 are tuned substantially to a common resonant frequency). Using resonant structures for coupling energy may be referred to as "magnetically coupled resonance," "electromagnetically coupled resonance," and/or "resonant induction."

With reference to FIG. 12, a power supply 1222 (e.g., AC or DC) with a voltage $V_S$ supplies power $P_S$ to the transmit power conversion circuit 1204. In some implementations, the transmit power conversion circuit 1204 includes circuitry such as an AC-to-DC converter configured to convert power from standard mains AC to DC power at a suitable DC voltage level, and a DC-to-AC frequency converter configured to convert DC power to power at an operating frequency $f_{wpt}$ suitable for wireless high power transfer (e.g., at 85 kHz). In some implementations, the transmit power conversion circuit 1204 includes an inverter amongst other circuitry for regulating the current $I_S$ drawn from the power supply 1222, the current $I_1$ in the transmit resonant circuit 1242, the voltage $V_1$ across the transmit resonant circuit 1224, and the power $P_1$ supplied to the transmit resonant circuit 1224. The transmit resonant circuit 1224 includes a tuning capacitor 1206 with capacitance $C_1$ in series with the transmit coil 1208 to compensate for the reactance of the transmit coil 1208 substantially at the operating frequency $f_{wpt}$. When excited by a current $I_1$, the transmit coil 1208 generates a magnetic field at the operating frequency $f_{wpt}$.

While the transmit resonant circuit 1224 is shown as series-tuned this should be considered as just one example implementation. Resonant circuits 1224a, 1224b, and 1224c provide just a few examples of other resonant topologies of parallel tuned, parallel series tuned, and the like. Other implementations may use further reactive components such as further capacitors or additional inductors (e.g., for filtering/matching and other purposes to form other topologies—e.g., LCL-topology, etc.). The transmit coil 1208 receives the power $P_1$ from the transmit power conversion circuit 1204 (e.g., AC current is driven into the transmit coil 1208) and wirelessly transmits power at a level sufficient to charge or power a load connected to the wireless power receive circuit 1232. For example, the level of power provided wirelessly by the transmit coil 1208 may be on the order of kilowatts (kW) (e.g., anywhere from 1 kW to 110 kW, although actual levels may be higher or lower).

The receive coil 1238 may be positioned within the near-field of the transmit coil 1208. In this case, the transmit coil 1208 and the receive coil 1238 may become wirelessly coupled (e.g., via a magnetic field) to one another such that power may be transferred wirelessly from the transmit coil 1208 to the receive coil 1238.

The series capacitor 1236 with capacitance $C_2$ may be provided to form a receive resonant circuit 1242 with the receive coil 1238 having an inductance $L_2$ that resonates substantially at the operating frequency $f_{wpt}$. The series-tuned receive resonant circuit 1242 should be construed as being exemplary and other resonant topologies may be used similarly as described with the transmit resonant circuit 1224 (e.g., with respect to resonant circuits 1224a, 1224b, and 1224c to form any combination of parallel or series topology).

FIG. 12 also indicates magnetic field coupling between transmit coil 1208 and receive coil 1238 with a coupling coefficient k(x,y,z) that is a function of the vertical separation (z) and horizontal displacement (x,y). If sufficiently coupled to the transmit coil 1208, the receive resonant circuit 1242 receives and provides the power $P_2$ to a receive power conversion circuit 1234 of the wireless power receive circuit 1232. An electrical current in the receive resonant circuit 1242 is represented by $I_2$ and a voltage across the receive resonant circuit 1242 is represented by $V_2$.

The receive power conversion circuit 1234 may include, among other things, an AC-to-DC converter configured to convert power at an operating frequency back to DC power at a voltage $V_L$ of the load 1240 that may represent a battery unit. In some implementations, the receive power conversion circuit 1234 includes a rectifier amongst other circuitry (e.g., DC-DC converter) for regulating the current $I_2$ in the receive coil 1238), the voltage $V_2$ across the receive resonant circuit 1242, the current $I_L$ and the power $P_L$ supplied to the load 1240.

The transmit power conversion circuit 1204 and/or the transmit resonant circuit 1224 may further include other matching and/or filter circuitry configured to match impedances between the transmit resonant circuit 1224 and the transmit power conversion circuit 1204 and provide other filter functions (e.g., harmonics filtering). Other amplifiers/oscillators and other circuitry for driving the transmit coil 1208 with the appropriate current/voltage is also contemplated. Likewise, the receive power conversion circuit 1234 and/or the receive resonant circuit 1242 may also include similar matching and/or filter circuitry.

While the term "coil" is used above, the transmit coil 1208 and the receive coil 1238 may also correspond to other forms of power transfer elements. As such, the term "coil" is intended to refer to a component that may wirelessly output or receive energy for coupling to another "coil." However, in particular exemplary implementations the transmit coil 1208 and the receive coil 1238 are configured as coils of wire (e.g., Litz wire) and be configured as "conductor loops", and more specifically, "multi-turn conductor loops."

While an example has provided for the implementations described herein to be part of an electric vehicle charging system, other these techniques/implementations described with reference to FIGS. 1-10 may be used for other applications.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general-purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for measuring changes in current for detecting objects, the apparatus comprising:
    a plurality of sense circuits each comprising a sense coil, the plurality of sense circuits each electrically connected to a common output node;
    a driver circuit electrically connected to the plurality of sense circuits, the driver circuit configured to operate as a voltage source and selectively apply a voltage signal at an operating frequency to each of the plurality of sense circuits, wherein operation as the voltage source corresponds to the driver circuit configured to apply the voltage signal, wherein a first magnitude of a fractional change of an output voltage $|\Delta V/V_{s,0}|$ of the driver circuit is at least a factor of 10 smaller than a second magnitude of a fractional change of an output current $|\Delta I/I_0|$ of the driver circuit; and
    a current measurement circuit electrically connected to the common output node, the current measurement circuit configured to provide a measurement output proportional to an electrical current at the common output node.

2. An apparatus for measuring changes in current for detecting objects, the apparatus comprising:
    a plurality of sense circuits each comprising a sense coil, the plurality of sense circuits each electrically connected to a common output node;
    a driver circuit electrically connected to the plurality of sense circuits, the driver circuit configured to operate as a voltage source and selectively apply a voltage signal at an operating frequency to each of the plurality of sense circuits;
    a current measurement circuit electrically connected to the common output node, the current measurement circuit configured to provide a measurement output proportional to an electrical current at the common output node;
    an amplifier circuit having an amplifier output; and
    a multiplexer electrically connected between the amplifier output and the plurality of sense circuits and configured to selectively connect each of the plurality of sense circuits to the amplifier output, the multiplexer being configured as a double switch input multiplexer configured to compensate for a voltage drop across switch resistances of a plurality of switches, each of the plurality of switches electrically connected between the amplifier output and a respective one of each of the plurality of sense circuits.

3. An apparatus for measuring changes in current for detecting objects, the apparatus comprising:
    a plurality of sense circuits each comprising a sense coil, the plurality of sense circuits each electrically connected to a common output node;

a driver circuit electrically connected to the plurality of sense circuits, the driver circuit configured to operate as a voltage source and selectively apply a voltage signal at an operating frequency to each of the plurality of sense circuits, the driver circuit comprising:
  an amplifier having a first amplifier input, a second amplifier input, and an amplifier output, the first amplifier input configured to receive an input signal; and
  a plurality of a switch circuits, each of the plurality of switch circuits electrically connected between the amplifier and a respective one of the plurality of sense circuits, each of the plurality of switch circuits comprising:
    a first switch electrically connected between the amplifier output of the amplifier and the respective one of the plurality of sense circuits; and
    a second switch electrically connected between the second amplifier input and a node between an output of the first switch and the respective one of the plurality of sense circuits; and
a current measurement circuit electrically connected to the common output node, the current measurement circuit configured to provide a measurement output proportional to an electrical current at the common output node.

4. The apparatus of claim 3, wherein an input impedance of the second amplifier input is sufficiently high to cause electrical current flowing through the second switch to be negligible or substantially zero.

5. The apparatus of claim 3, wherein the amplifier is configured to adjust an output voltage level at the amplifier output based on the second amplifier input via the second switch of each of the plurality of switch circuits to compensate for a voltage drop across a switch resistance of the first switch of each of the plurality of switch circuits.

6. The apparatus of claim 3, further comprising a capacitor electrically connected between the amplifier output and the second amplifier input.

7. An apparatus for measuring changes in current for detecting objects, the apparatus comprising:
  a plurality of sense circuits each comprising a sense coil, the plurality of sense circuits each electrically connected to a common output node, each of the plurality of sense circuits including a first capacitor electrically connected in series with the sense coil to form a resonant circuit configured to resonate substantially at an operating frequency;
  a driver circuit electrically connected to the plurality of sense circuits, the driver circuit configured to operate as a voltage source and selectively apply a voltage signal at the operating frequency to each of the plurality of sense circuits, each of the plurality of sense circuits including:
    a second capacitor electrically coupled between the driver circuit and a respective one of a plurality of series circuits formed by the sense coil and the first capacitor in each of the plurality of sense circuits; or
    a shunt inductor electrically connected in parallel to the series circuit of the sense coil and the first capacitor; and
  a current measurement circuit electrically connected to the common output node, the current measurement circuit configured to provide a measurement output proportional to an electrical current at the common output node.

8. The apparatus of claim 7, wherein the shunt inductor is configured as a filter configured to attenuate voltages induced into the sense coil at a wireless power frequency different than the operating frequency.

9. apparatus for measuring changes in current for detecting objects, the apparatus comprising:
  a plurality of sense circuits each comprising a sense coil, the plurality of sense circuits each electrically connected to a common output node;
  a driver circuit electrically connected to the plurality of sense circuits, the driver circuit configured to operate as a voltage source and selectively apply a voltage signal at an operating frequency to each of the plurality of sense circuits; and
  a current measurement circuit electrically connected to the common output node, the current measurement circuit configured to provide a measurement output proportional to an electrical current at the common output node, the current measurement circuit including a current measurement amplifier circuit configured to produce the measurement output as a measurement voltage that is proportional to the electrical current at the common output node, the current measurement amplifier circuit comprising:
    an amplifier having a first input electrically connected to the common output node and a second input electrically connected a ground reference; and
    a feedback resistor electrically connected between the first input and an output of the amplifier.

10. An apparatus for measuring changes in current for detecting objects, the apparatus comprising:
  a plurality of sense circuits each comprising a sense coil, the plurality of sense circuits each electrically connected to a common output node;
  a driver circuit electrically connected to the plurality of sense circuits, the driver circuit configured to operate as a voltage source and selectively apply a voltage signal at an operating frequency to each of the plurality of sense circuits;
  a current measurement circuit electrically connected to the common output node, the current measurement circuit configured to provide a measurement output proportional to an electrical current at the common output node; and
  at least one of:
    a transformer electrically connected between the common output node and the current measurement circuit, the transformer having a turns ratio that transforms a level of electrical current at the common output node to a lower current level at an input of the current measurement circuit; or
    a capacitor electrically connected between the common output node and the current measurement circuit.

11. An apparatus for measuring changes in current for detecting objects, the apparatus comprising:
  a plurality of sense circuits each comprising a sense coil, the plurality of sense circuits each electrically connected to a common output node, each sense coil of the plurality of sense circuits positioned to be distributed over a predetermined area at least partially defined by a wireless power transmit coil configured to inductively transfer power;
  a driver circuit electrically connected to the plurality of sense circuits, the driver circuit configured to operate as a voltage source and selectively apply a voltage signal at an operating frequency to each of the plurality of sense circuits, the operating frequency being different than a frequency of a magnetic field generated by the wireless power transmit coil; and a current measurement circuit electrically connected to the common output node, the current measurement circuit configured to provide a measurement output proportional to an electrical current at the common output node.

12. The apparatus of claim 11, wherein the measurement output proportional to the electrical current at the common output node corresponds to at least one of:

an electrical current in at least one of the plurality of sense circuits in response to the voltage signal being applied to the at least one of the plurality of sense circuits; or a sum of electrical current in one or more of the plurality of sense circuits in response to the voltage signal being applied to the one or more of the plurality of sense circuits.

13. The apparatus of claim 1, wherein:

each sense coil of the plurality of sense circuits is positioned to be distributed over a predetermined area at least partially defined by a wireless power transmit coil configured to inductively transfer power; and a frequency of a magnetic field generated by the wireless power transmit coil is different than the operating frequency of the voltage signal that is selectively applied by the driver circuit to each of the plurality of sense circuits.

14. The apparatus of claim 1, further comprising a detection circuit electrically connected to the current measurement circuit and configured to determine whether an object is proximate at least one sense coil of the plurality of sense circuits based on the measurement output proportional to the electrical current.

15. The apparatus of claim 2, wherein:

each sense coil of the plurality of sense circuits is positioned to be distributed over a predetermined area at least partially defined by a wireless power transmit coil configured to inductively transfer power; and the operating frequency is different than a frequency of a magnetic field generated by the wireless power transmit coil.

16. The apparatus of claim 2, further comprising a detection circuit electrically connected to the current measurement circuit and configured to determine whether an object is proximate at least one sense coil of the plurality of sense circuits based on the measurement output proportional to the electrical current.

17. The apparatus of claim 3, wherein:

each sense coil of the plurality of sense circuits is positioned to be distributed over a predetermined area at least partially defined by a wireless power transmit coil configured to inductively transfer power; and the operating frequency is different than a frequency of a magnetic field generated by the wireless power transmit coil.

18. The apparatus of claim 7, wherein:

each sense coil of the plurality of sense circuits is positioned to be distributed over a predetermined area at least partially defined by a wireless power transmit coil configured to inductively transfer power; and the operating frequency is different than a frequency of a magnetic field generated by the wireless power transmit coil.

19. The apparatus of claim 7, further comprising a detection circuit electrically connected to the current measurement circuit and configured to determine whether an object is proximate at least one sense coil of the plurality of sense circuits based on the measurement output proportional to the electrical current.

20. The apparatus of claim 9, wherein:

each sense coil of the plurality of sense circuits is positioned to be distributed over a predetermined area at least partially defined by a wireless power transmit coil configured to inductively transfer power; and a frequency of a magnetic field generated by the wireless power transmit coil is different than the operating frequency of the voltage signal that is selectively applied by the driver circuit to each of the plurality of sense circuits.

21. The apparatus of claim 9, further comprising a detection circuit electrically connected to the current measurement circuit and configured to determine whether an object is proximate at least one sense coil of the plurality of sense circuits based on the measurement output proportional to the electrical current.

22. The apparatus of claim 9, wherein the amplifier comprises a transimpedance amplifier configured to provide the measurement voltage.

23. The apparatus of claim 9, further comprising a current transformer configured to transform a level of current at an input of the current measurement circuit to a lower level at an input of the amplifier.

24. The apparatus of claim 23, wherein the current transformer is configured to suppress low frequency components and inductively or capacitively coupled to the sense coils of the plurality of sense circuits.

25. The apparatus of claim 23, wherein:

the amplifier uses a first ground that is separate from a second ground used by the plurality of sense circuits; and the current transformer is configured to provide decoupling of the amplifier from the sense coils of the plurality of sense circuits.

26. The apparatus of claim 23, further comprising a capacitor between the current transformer and the amplifier, the capacitor configured to block a direct current component and provide additional attenuation of low frequency signal components.

27. The apparatus of claim 10, wherein:

each sense coil of the plurality of sense circuits is positioned to be distributed over a predetermined area at least partially defined by a wireless power transmit coil configured to inductively transfer power; and the operating frequency is different than a frequency of a magnetic field generated by the wireless power transmit coil.

28. The apparatus of claim 10, further comprising a detection circuit electrically connected to the current measurement circuit and configured to determine whether an object is proximate at least one sense coil of the plurality of sense circuits based on the measurement output proportional to the electrical current.

29. The apparatus of claim 11, further comprising a detection circuit electrically connected to the current measurement circuit and configured to determine whether an object is proximate at least one sense coil of the plurality of sense circuits based on the measurement output proportional to the electrical current.

30. The apparatus of claim 11, wherein operation as the voltage source corresponds to the driver circuit configured to maintain an output wherein changes in electrical impedance of the sense coil of at least one of the plurality of sense circuits or changes in electrical current at the common output node have a substantially negligible impact on the voltage signal.

* * * * *